(12) United States Patent
Kuznicki et al.

(10) Patent No.: US 9,519,739 B1
(45) Date of Patent: Dec. 13, 2016

(54) PARALLEL EXECUTION OF FUNCTION CALLS IN A GRAPHICAL MODEL

(71) Applicant: The MathWorks, Inc., Natick, MA (US)

(72) Inventors: Steven E. Kuznicki, Northville, MI (US); Chad M. Van Fleet, South Lyon, MI (US)

(73) Assignee: The MathWorks, Inc., Natick, MA (US)

( * ) Notice: Subject to any disclaimer, the term of this patent is extended or adjusted under 35 U.S.C. 154(b) by 213 days.

(21) Appl. No.: 14/039,344

(22) Filed: Sep. 27, 2013

Related U.S. Application Data

(63) Continuation of application No. 12/723,253, filed on Mar. 12, 2010, now Pat. No. 8,561,041.

(60) Provisional application No. 61/219,172, filed on Jun. 22, 2009.

(51) Int. Cl.
*G06F 9/44* (2006.01)
*G06F 17/50* (2006.01)
*G06F 9/45* (2006.01)
*G06F 9/50* (2006.01)

(52) U.S. Cl.
CPC .......... *G06F 17/5022* (2013.01); *G06F 8/433* (2013.01); *G06F 9/5066* (2013.01)

(58) Field of Classification Search
CPC .......... G06F 8/34; G06F 8/433; G06F 11/323; G06F 17/5009; G06F 8/456; G06F 8/71; G06F 9/30; G06F 9/3009; G06F 9/3836; G06F 11/3604; G06F 8/20; G06F 8/30; G06F 9/5066
See application file for complete search history.

(56) References Cited

U.S. PATENT DOCUMENTS

| 6,035,123 | A  | * | 3/2000  | Razdan    | G06F 8/443  |
|           |    |   |         |           | 712/E9.035  |
| 6,598,222 | B2 | * | 7/2003  | Uchihira  | G06F 8/30   |
|           |    |   |         |           | 714/E11.208 |
| 7,010,787 | B2 | * | 3/2006  | Sakai     | G06F 8/456  |
|           |    |   |         |           | 712/E9.032  |
| 7,143,392 | B2 | * | 11/2006 | li et al. | 717/125     |
| 8,074,211 | B2 |   | 12/2011 | Sakai     |             |
| 8,108,845 | B2 |   | 1/2012  | Little et al. |         |

(Continued)

OTHER PUBLICATIONS

Michael Isard et al.; Dryad Distributed Data-Parallel Programs from Sequential Building Blocks; 2007 ACM; pp. 59-72; <http://dl.acm.org/citation.cfm?id=1273005>.*

(Continued)

*Primary Examiner* — Thuy Dao
*Assistant Examiner* — Cuong V Luu
(74) *Attorney, Agent, or Firm* — Harrity & Harrity, LLP

(57) ABSTRACT

A method, tangible computer-readable medium and apparatus for concurrently executing subsystems in a graphical model is provided. An embodiment can transform a conventional graphical model supporting single threaded execution into a model supporting multi-threaded execution through the replacement of a single block. The transformed model may support concurrent execution of a plurality of subsystems using a plurality of threads when the graphical model executes. An embodiment provides a user interface that allows a user to intuitively configure a model for current execution of the subsystems.

21 Claims, 16 Drawing Sheets

(56) References Cited

U.S. PATENT DOCUMENTS

| | | | |
|---|---|---|---|
| 8,117,588 B2* | 2/2012 | Kornerup | G06F 8/34 717/104 |
| 8,127,283 B2 | 2/2012 | Sheynin et al. | |
| 8,136,097 B2 | 3/2012 | Konishi et al. | |
| 8,234,635 B2* | 7/2012 | Isshiki | G06F 8/456 717/140 |
| 8,359,459 B2* | 1/2013 | Gove | 712/220 |
| 2003/0056199 A1* | 3/2003 | Li et al. | 717/127 |
| 2005/0144602 A1* | 6/2005 | Ngai | G06F 8/41 717/151 |
| 2007/0168975 A1 | 7/2007 | Kessler | |
| 2007/0168985 A1* | 7/2007 | Konishi et al. | 717/124 |
| 2008/0127146 A1* | 5/2008 | Liao | G06F 8/456 717/150 |
| 2008/0229220 A1 | 9/2008 | Jing | |
| 2009/0064115 A1* | 3/2009 | Sheynin et al. | 717/149 |
| 2009/0300643 A1* | 12/2009 | Gove | 718/106 |
| 2010/0306753 A1* | 12/2010 | Yi | G06F 8/4452 717/149 |

OTHER PUBLICATIONS

Peter Kacsuk; A graphical development and debugging environment for parallel programs; 1997 Elsevier Science; pp. 1748-1770; <http://www.sciencedirect.com/science/article/pii/S0167819196000750>.*

David Socha et al.; Voyeur Graphical Views of Parallel Programs; 1988 ACM; pp. 206-215; <http://dl.acm.org/citation.cfm?id=69235>.*

Vivek Sarkar et al.; Compile-time Partitioning and Scheduling of Parallel Programs; 1986 ACM; pp. 17-26; <http://dl.acm.org/citation.cfm?id=13313>.*

Weiming Gu et al.; Falcon On-line Monitoring and Steering of Large-scale Parallel Programs; 1995 IEEE; pp. 422-429; <http://ieeexplore.ieee.org/stamp/stamp.jsp?tp=&arnumber=380483>.*

Thomas J. Leblanc et al.; Debugging Parallel Programs with Instant Replay; 1987 IEEE; pp. 471-482; <http://ieeexplore.ieee.org/stamp/stamp.jsp?tp=&arnumber=1676929>.*

Co-pending U.S. Appl. No. 12/723,253, entitled "Parallel Execution of Function Calls in a Graphical Model", filed Mar. 12, 2010, 50 pages.

E. N. Houstis et al., "ELLPACK: A Numerical Simulation Programming Environment for Parallel MIMD Machines", 1990 ACM; pp. 96-107, http://dl.acm.org/citation.cfm?id=255144.

T. Delaitre et al., "A Graphical Toolset for Simulation Modelling of Parallel Systems", 1997 Elsevier Science B.V., pp. 1823-1837, http://www.sciencedirect.com/science/article/pii/S0167819196000798.

Daniel Pease et al., "PAWS: A Performance Evaluation Tool for Parallel Computing Systems", 1991 IEEE, pp. 18-36, http://ieeexplore.ieee.org/stamp/jsp?tp=arnumber=67190.

Sabri Pilana et al., "Performance Prophet: A Performance Modeling and Prediction Tool for Parallel and Distributed Programs", 2005 IEEE, 8 pages, http://ieeexplore.ieee.org/stamp/jsp?tp=&arnumber=1488736.

Jim Larson, "Erlang for Concurrent Programming", 2009 Erlang.org, pp. 48-56, http://dl.acm.org/citation.cfm?id=1467247.

Simonetta Balsamo et al., "Model-Based Performance Prediction in Software Development: A Survey", 2004 IEEE, pp. 295-310, http://ieeexplore.ieee.org/stamp/jsp?tp=&arnumber=1291833.

* cited by examiner

PARALLEL EXECUTION OF FUNCTION CALLS IN A GRAPHICAL MODEL

RELATED APPLICATIONS

The instant application is a continuation of U.S. patent application Ser. No. 12/723,253, filed Mar. 12, 2010, and claims priority under 35 U.S.C. §119 to U.S. Provisional Patent Application No. 61/219,172, filed Jun. 22, 2009, the contents of which are incorporated by reference herein in their entirety.

BACKGROUND INFORMATION

Models may be used to simulate physical systems. For example, a graphical model may be used to represent a complex control system for a plant. The graphical model may include entities, such as blocks, that reference executable code for performing operations of the control system when the graphical model executes. The blocks can vary in type and/or number and may be connected together to build large, complex models (e.g., models including hundreds or more interconnected blocks).

Blocks can include function calls that perform an operation when the function of the block is executed. One way of representing function calls in a model is via function-call subsystem block. Function-call subsystem blocks may simplify a model by allowing multiple blocks and/or operations to be represented via a single block referred to as a function-call subsystem.

When a model includes more than one function-call subsystem, a technique may be required for executing the function-call subsystems in a determined order. Since graphical models support single threaded execution, a first function-call subsystem may need to execute on a main thread before a second function-call subsystem can execute. Conventional techniques may use a function-call generator block to inform function-call subsystems as to when to execute on the main thread to support serial execution of the model.

As models become large and/or complex, serial model execution on a single thread may not take advantage of available multi-processing capabilities and may produce undesirably long model execution times.

BRIEF DESCRIPTION OF THE DRAWINGS

The accompanying drawings, which are incorporated in and constitute a part of this specification, illustrate one or more embodiments of the invention and, together with the description, explain the invention. In the drawings.

DETAILED DESCRIPTION

Figure 1:
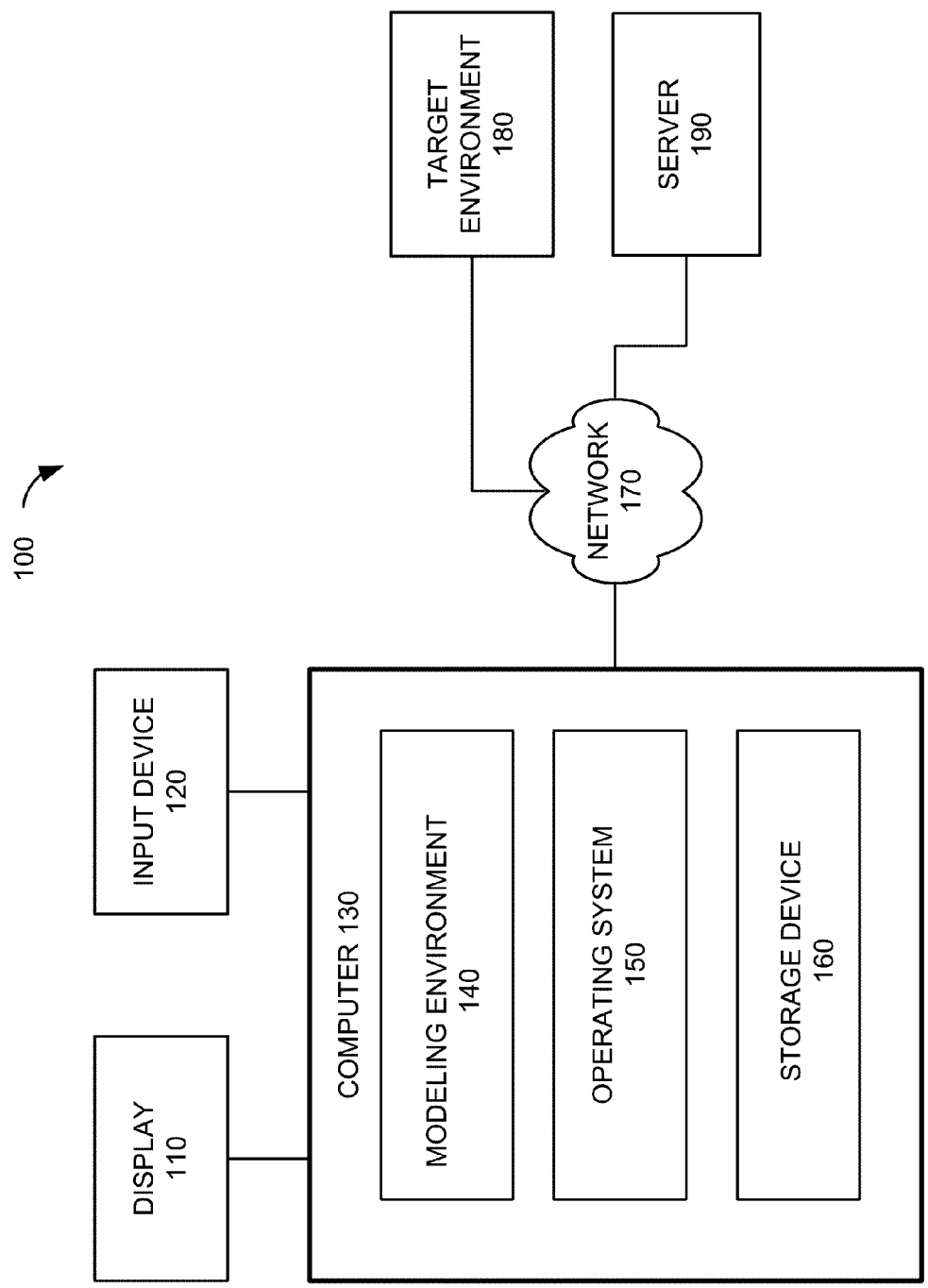
FIG. 1 illustrates an exemplary system for practicing an embodiment.

The following detailed description of implementations consistent with principles of the invention refers to the accompanying drawings. The same reference numbers in different drawings may identify the same or similar elements. Also, the following detailed description does not limit the invention. Instead, the scope of the invention is defined by the appended claims and their equivalents.

Overview

Users may create complex graphical models having hundreds or even thousands of components (e.g., blocks). In some instances, a user may employ function-call subsystems (FCS's) to group two or more components into a single graphical representation (e.g., a block) to simplify the model and to facilitate executing the model in a determined order. For example, using conventional techniques a user may place two FCS's into a model. The user may place a function-call generator block (FCGB) into the model and may connect the FCGB to the FCS's via function-call lines. The FCGB may execute one FCS and may execute the second FCS when the first FCS has executed. The conventional model may have to perform serial execution of the FCS's because the model and components in the model, such as the FCGB, may only support single threaded execution. FCGB's are used herein for illustrative purposes as a type of component that can be used to initiate a function call. Other implementations of the invention may use other techniques, such as but not limited to, state charts, hardware interrupt blocks (also referred to as asynchronous S-functions), etc., to initiate function calls consistent with the principles of the invention.

Exemplary embodiments provide a user with the ability to execute FCS's in parallel, or concurrently, when the FCS's do not have data dependencies between them. For example, a model may include a first FCS that performs a first operation and a second FCS that performs a second operation in the model. Moreover, the first FCS may not communicate with the second FCS, thus indicating no data dependency between the two FCS's. The embodiment may allow a user to replace a conventional FCGB with a concurrent function-call generator block (C-FCGB) that allows the model to execute the first FCS and the second FCS concurrently, i.e., at the same time, using two or more threads.

The C-FCGB includes logic that allows the user to configure the block to support concurrent execution using a plurality of threads. The user may indicate a number of processing devices on which to perform concurrent processing and may associate FCS's with the plurality of threads. Once processing devices and FCS's are identified, threads are spawned at model execution and are uses to concurrently execute specified FCS's on the specified processing devices via the spawned threads.

Exemplary embodiments allow the user to perform simulations many times faster than with conventional models configured for serial execution. Exemplary embodiments may analyze FCS's to ensure that no data dependencies exist between FCS's identified for concurrent execution. Exemplary embodiments may further generate code for models configured for concurrent execution such that the generated code executes concurrently in a target environment.

Exemplary System

FIG. 1 illustrates an exemplary system 100 for practicing an embodiment. For example, system 100 may be used to construct models that include one or more entities (e.g., FCS's), to execute the models using a two or more threads, generate code from the models, and/or display model results to a user. System 100 may include display 110, input device 120, computer 130, network 170, target environment 180 and server 190. The system in FIG. 1 is illustrative and other embodiments of system 100 can include fewer devices, more devices, and/or devices in configurations that differ from the configuration of FIG. 1.

Display 110 may include a device that displays information to a user. Display 110 may include a cathode ray tube (CRT), plasma display device, light emitting diode (LED) display device, liquid crystal display (LCD) device, etc. Embodiments of display 110 may be configured to receive user inputs (e.g., via a touch sensitive screen) when desired. In an embodiment, display 110 can display one or more graphical user interfaces (GUIs) to a user. The GUIs may display a model, inputs for a model (e.g., user specified objectives, constraints, etc.), model outputs, and/or other types of information to a user.

Input device 120 may include logic to receive input from a user. For example, input device 120 may transform a user motion or action into a signal or message that can be interpreted by computer 130. Input device 120 can include, but is not limited to, keyboards, pointing devices, biometric devices, accelerometers, microphones, cameras, haptic devices, etc. In an embodiment, input device 120 may receive inputs from a user specifying objectives and constraints to be applied to a model, creating subsystems in the model, inserting a block to perform concurrent processing using the subsystems, etc. Display 110 may display results of the models to the user when the models execute.

Computer 130 may include a device that performs processing operations, display operations, communication operations, etc. For example, computer 130 may include logic, such as one or more processing or storage devices, that can be used to perform and/or support processing activities on behalf of a user. Embodiments of computer 130 may include a desktop computer, a laptop computer, a client, a server, a mainframe, a personal digital assistant (PDA), a web-enabled cellular telephone, a smart phone, smart sensor/actuator, or another computation or communication device that executes instructions to perform one or more activities and/or to generate one or more results.

Computer 130 may further perform communication operations by sending data to or receiving data from another device, such as server 190. Data may refer to any type of machine-readable information having substantially any format that may be adapted for use in one or more networks and/or with one or more devices. Data may include digital information or analog information. Data may further be packetized and/or non-packetized.

An embodiment of computer 130 may include modeling environment 140, operating system 150, and storage device 160. Modeling environment 140 may provide a computing environment that allows users to perform simulation or modeling tasks related to disciplines, such as, but not limited to, mathematics, science, engineering, medicine, business, etc. Modeling environment 140 may support one or more applications that execute instructions to allow a user to construct a model having executable semantics. In an embodiment, modeling environment 140 may execute the model to produce a result.

Models used with exemplary embodiments of the invention may include information in a textual or graphical form. For example, a model may be a graphical model that can be time-based model (e.g., differential equation models, difference equation models or discrete-time models with or without algebraic constraints, etc.), event-based model, state transition model, data flow model, component diagram, entity flow diagram, equation-based language diagram, etc.

Operating system 150 may manage hardware and/or software resources associated with computer 130. For example, operating system 150 may manage tasks associated with receiving user inputs, operating computer 130, allocating memory, prioritizing system requests, etc. In an embodiment, operating system 150 may be a virtual operating system. Embodiments of operating system 150 may include Linux, Mac OS, Microsoft Windows, Solaris, UNIX, etc. Operating system 150 may further run on a virtual machine, which can be provided by computer 130.

Storage device 160 may include a magnetic, solid state and/or optical recording medium and its corresponding drive, or another type of static storage device that may store static information and/or instructions for use by computer 130. Exemplary embodiments of storage device can include random access memory (RAM) or another type of dynamic storage device that may store information and instructions for execution by processing logic operating in computer 130. Storage device 160 may further include read only memory (ROM), and/or other types of static storage.

Network 170 may include any network capable of transferring data (e.g., packet data or non-packet data). Implementations of network 170 may include local area networks (LANs), metropolitan area networks (MANs) and/or wide area networks (WANs), such as the Internet, that may operate using substantially any network protocol, such as Internet protocol (IP), asynchronous transfer mode (ATM), synchronous optical network (SONET), user datagram protocol (UDP), IEEE 802.10, etc.

Network 170 may include network devices, such as routers, switches, firewalls, and/or servers (not shown). Network 170 may be a hardwired network using wired conductors and/or optical fibers and/or may be a wireless network using free-space optical, radio frequency (RF), and/or acoustic transmission paths. In an implementation, network 170 may be a substantially open public network, such as the Internet. In another implementation, network 170 may be a more restricted network, such as a corporate virtual network. Implementations of networks and/or devices operating on networks described herein are not limited to any particular data type, protocol, architecture/configuration, etc. For example, in an embodiment, network 170 may be a quantum network that uses quantum-compatible networking protocols.

Target environment 180 may include logic that executes instructions to perform one or more operations. In an embodiment, target environment 180 can include processing logic adapted to execute code generated from one or more models. In an embodiment, target environment 180 can include real-time logic for performing processing operations in real-time. For example, target environment 180 may include a real-time operating system and hardware that are configured to process received signals or events in real-time or to execute simulations in real-time.

Exemplary embodiment of target environment 180 can include field programmable gate arrays (FPGAs), application specific integrated circuits (ASICs), application specific instruction-set processors (ASIPs), digital signal processors (DSPs), graphics processor units (GPUs), programmable logic devices (PLDs), etc. Target environments 180 can further include a single processor that includes two or more types of logic, such as cores. Target environments 180 can be configured to support multi-threaded or multi-process applications using FPGAs, ASICs, ASIPs, DSPs, GPUs, PLDs, cores, etc.

Server 190 may include a device that receives data from, and sends data to, another device and/or network. For example, server 190 may include one or more server devices/computers (e.g., a workstation, mainframe, desktop computer, laptop computer, PDA, web enabled cellular telephone, smart phone, Wi-Fi device, smart sensor/actuator, or another type of device). Server 190 may be implemented as a standalone device, a distributed arrangement of devices (e.g., a cluster or pool of devices) arranged in substantially any type of configuration (e.g., star, ring, grid, etc.). Distributed implementations of server 190 may further include devices, such as load balancers, schedulers, network devices, etc., to allow distributed implementations of server 190 to operate in a determined manner.

In one implementation, server 190 may provide a service to other devices in system 100, such as computer 130. For example, server 190 may provide remote processing services to computer 130 via network 170.

Exemplary Modeling Environment

Figure 2:
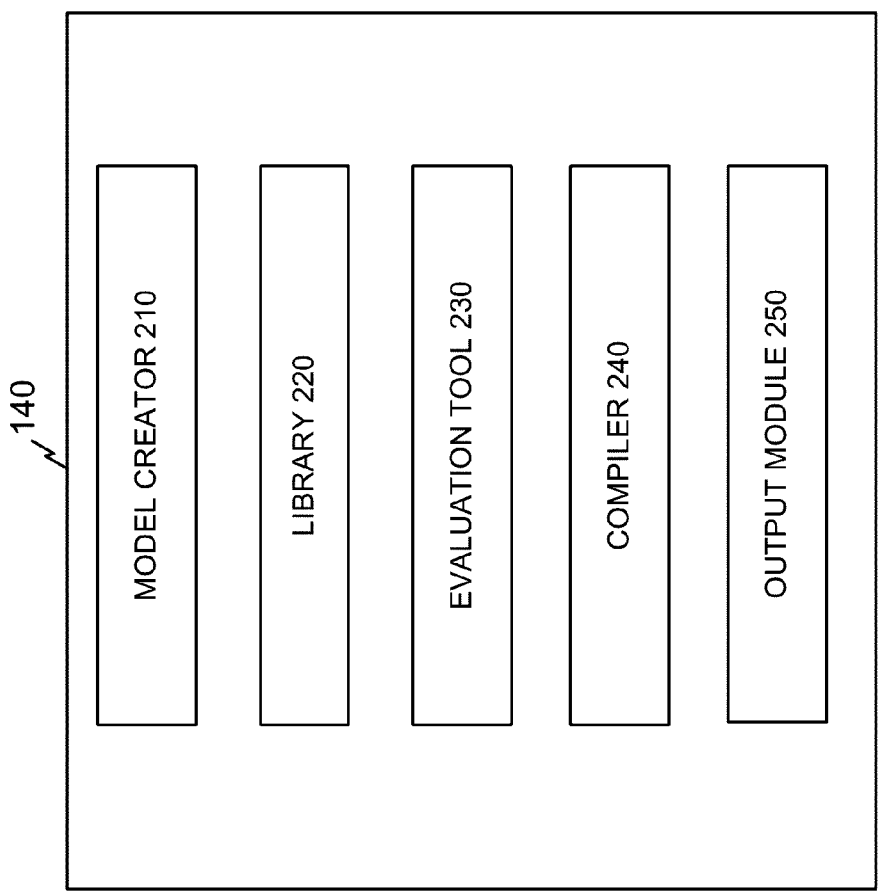
FIG. 2 illustrates an exemplary embodiment of the modeling environment of FIG. 1.

FIG. 2 illustrates an exemplary embodiment of a modeling environment 140. Modeling environment 140 can include model creator 210, library 220, evaluation tool 230, compiler 240, and output module 250. The embodiment of modeling environment 140 illustrated in FIG. 2 is illustrative and other embodiments of modeling environment 140 can include more entities or fewer components without departing from the spirit of the invention.

Model creator 210 may be an application for building a model. Model creator 210 can be used to build a graphical model having executable semantics. For example, model creator 210 may allow users to create, modify, diagnose, delete, etc., model entities and/or connections. For example, model creator 210 may display a canvas onto which a user can place blocks, connections (e.g., function-call lines, signal lines, etc.), etc., for creating a model of a dynamic system. Model creator 210 may interact with other entities illustrated in FIG. 1 or 2 for receiving user inputs, executing a model, displaying results, generating code, etc.

Library 220 may include code modules or entities, e.g., blocks/icons, and/or connections (e.g., lines) that a user can drag and drop onto a canvas that includes a model. In the case of graphical models, a user may further couple entities obtained from the library using connections to produce a graphical model of a system.

Evaluation tool 230 may evaluate a graphical model to determine whether data dependencies exit between subsystems in the model, such as FCS's. In an embodiment, evaluation tool 230 may include code for receiving user inputs specifying criteria for executing a model using concurrent processing techniques, such as multi-threaded execution. Evaluation tool 230 may further allow a user to identify components to be executed concurrently. Evaluation tool 230 may determine whether data dependencies exist between the identified components, and when they do an error may be provided to the user indicating that the components cannot be executed concurrently.

Compiler 240 may compile a model into an executable format. Compiled code produced by compiler 240 may be executed on computer 130 to produce a modeling result. In an embodiment, compiler 240 may also provide a user with debugging capabilities for diagnosing errors associated with the model and profiling capabilities for analyzing performance characteristics. Embodiments of compiler 240 may interact with evaluation tool 230 to, for example, allow evaluation tool 230 to store information related to compiler switch settings used to compile a model.

Output module 250 may include code for generating one or more outputs from a model when the model is executed. For example, output module 250 may display a model, a modeling result, and user interfaces for specifying processors used to concurrently execute the model. In an embodiment, output module 250 may create a graphical user interface (GUI) for displaying information to a user. Output module 250 may further produce other types of output from a model, such as generated code. In an embodiment, generated code can be configured for multi-threaded execution in target environment 180, which may be, for example, an embedded system.

Exemplary Model

Figure 3:
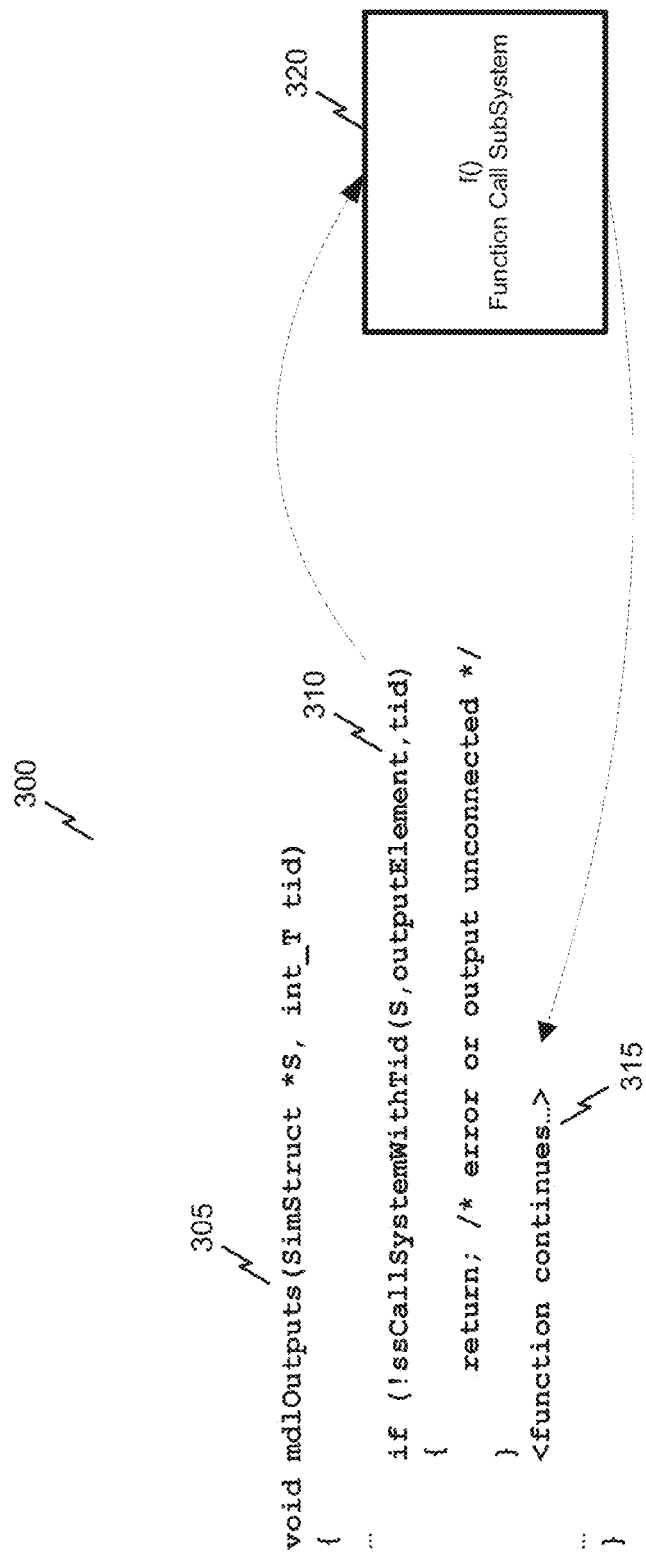
FIG. 3 illustrates a prior art technique for implementing a conventional function-call subsystem in a model.

FIG. 3 illustrates a prior art technique for implementing a conventional function-call subsystem in a model. In arrangement 300, program code 305 may include a call to an FCS 310. When call 310 is encountered, instructions associated with FCS 320 may be executed and may produce a result. When instructions associated with FCS 320 have executed, control may be returned to program code 305 via instruction 315.

A user may implement one or more FCS's, such as FCS 320, in a graphical model to perform a simulation. For example, a user may build a model that includes three FCS's, which is illustrated in FIG. 4.

Figure 4:
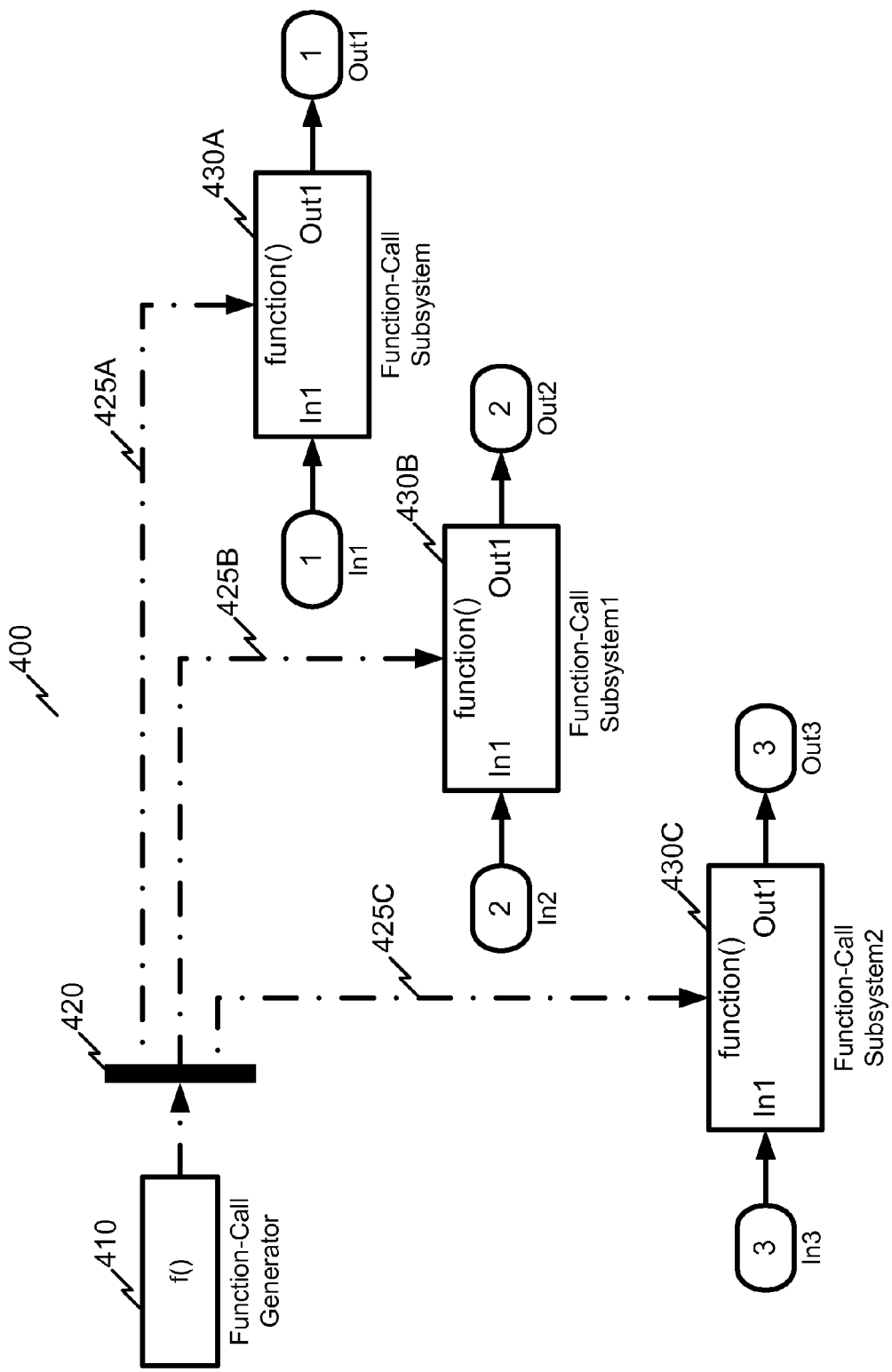
FIG. 4 illustrates a prior art technique for using a function-call generator and demultiplexer to support serial execution of function-call subsystems in a model.

FIG. 4 illustrates a prior art technique for using a FCG and demultiplexer to support serial execution of three FCS's in a model. For example, model 400 may include function-call generator (FCG) 410, demultiplexer (demux) 420, connections 425A, B and C, and FCS's 430A, B, and C. FCS's 430A, B, and C may be configured to perform certain operations when model 400 executes. When model 400 is executed, FCG 410 may interact with demux 420 to provide instructions to FCS's 430A, B, and C, respectively. The instructions may cause one of the FCS's to execute at a determined time. In the conventional model of FIG. 4, FCS's 430A, B and C execute serially, in that only one FCS can execute at a time. For example, a subsequent FCS can only execute when a currently executing FCS has finished executing.

Referring to FIG. 4, FCS's 430A, B, and C may be configured to execute in the following order: FCS 430A, then FCS 430B, and then FCS 430C. When FCG 410 sends an instruction to demux 420 to execute the first FCS, demux 420 sends an instruction to FCS 430A via function-call line 425A. FCS 430A executes in response to the instruction and produces a result. When FCS 430A has finished executing, FCG 410 can cause demux 420 to send an instruction to FCS 430B via function-call line 425B. FCS 430B may execute in response to the instruction and may produce a result. FCG 410 may then send an instruction to FCS 430C via demux 420 and function-call line 425C, and FCS 430C may execute in response to the instruction and may produce a result.

Exemplary Single Threaded Processing

Figure 5:
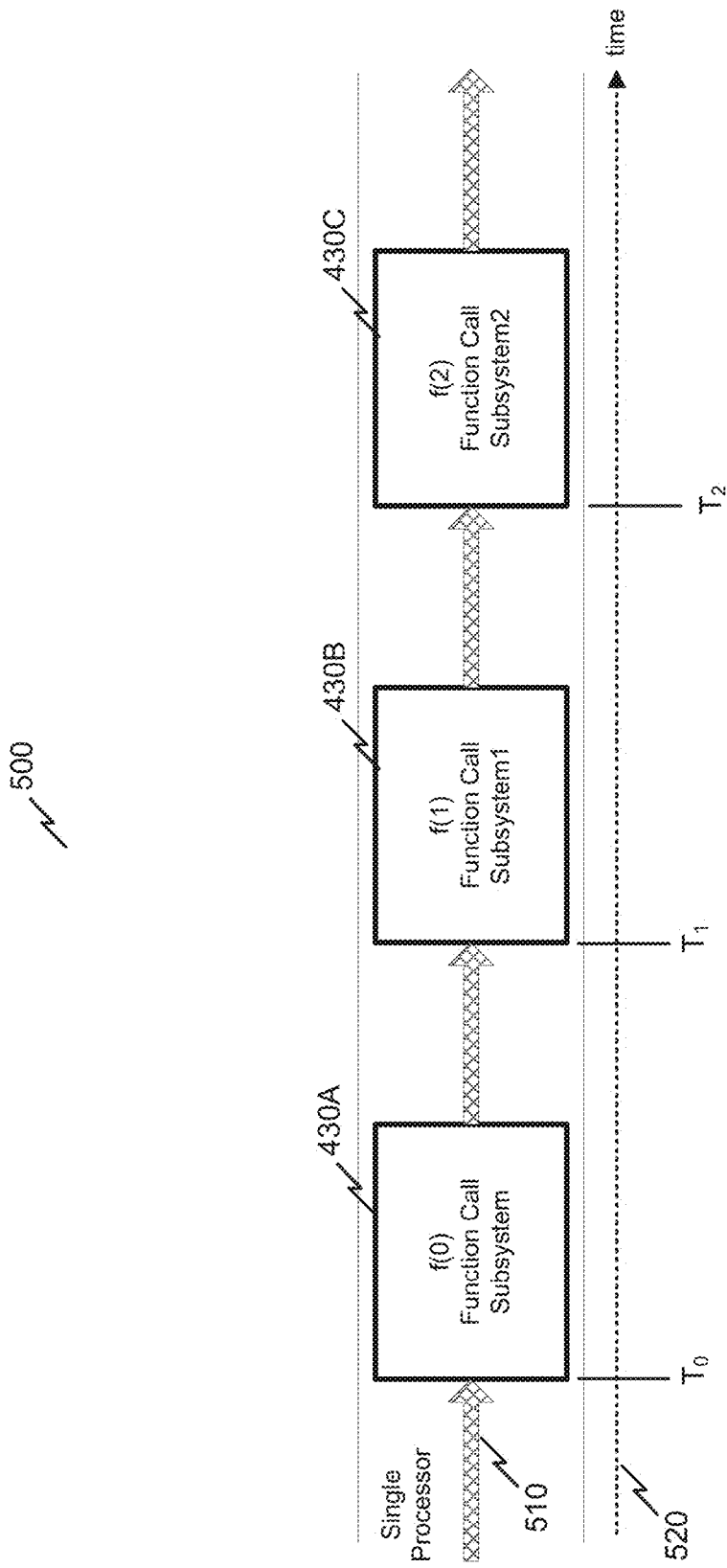
FIG. 5 illustrates the prior art technique of FIG. 4 with respect to a time axis.

FIG. 5 illustrates the serial processing of FIG. 4 along a time axis. A single processor may be provided in computer 130 and made available to model 400. The single processor may support a processing flow 510 (e.g., a single thread) with respect to time. In FIG. 5 time may be represented via time axis 520 with units of time (e.g., milliseconds) increasing toward the right margin of FIG. 5. FCG 410 may initiate FCS 430A first (e.g. at time $T_0$), and then may initiate FCS 430B at a later time (e.g., $T_1$) once FCS 430A has finished running (i.e., before $T_1$). FCG 410 may then initiate FCS 430C at a still later time (e.g., $T_2$) once FCS 430B has finished running. As seen from FIG. 5, conventional graphical modeling environments support a single processing flow, or thread, within a particular simulation.

Figure 6:
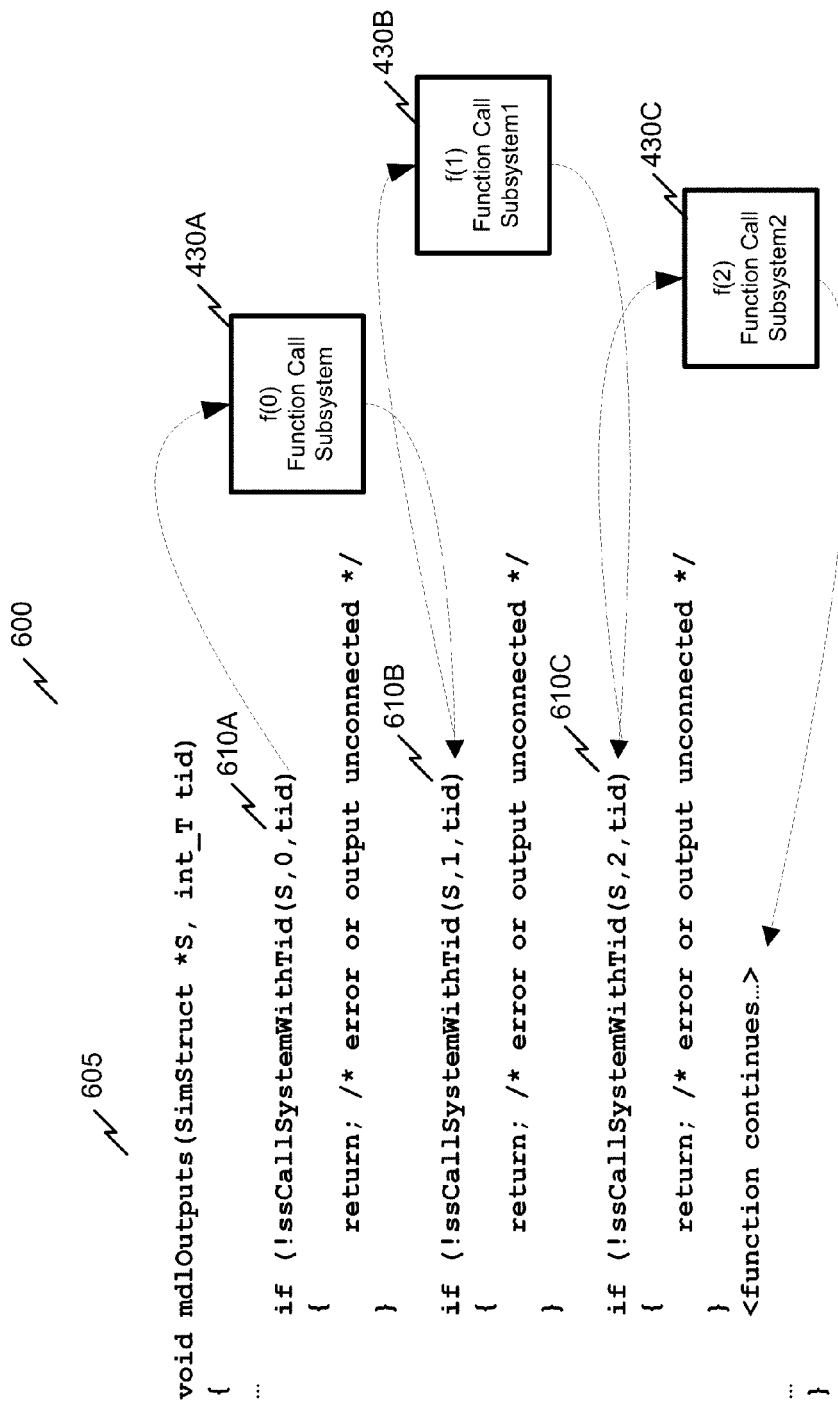
FIG. 6 illustrates schematically illustrates the prior art technique of FIG. 4 with respect to code calling the function-call subsystems in a serial fashion.

FIG. 6 schematically illustrates the prior art technique of FIG. 4 with respect to code calling FCS's in a serial fashion. Arrangement 600 may include program code 605 and FCS's 430A, B, and C. Code 605 may execute and may make a first call 610A to FCS 430A. When called, FCS 430A may execute and may produce a first result. After FCS 430A has executed, code 605 may make a second call 610B that may cause FCS 430B to execute and produce a second result. After FCS 430B has executed, code 605 may call FCS 430C, and FCS 430C may execute to produce a third result. When FCS 430C has finished executing other portions of code 605 may execute.

In FIG. 6, only one FCS at a time can execute. Subsequent FCS's (e.g., FCS 430B with respect to FCS 430A) cannot execute until the previous FCS has finished executing. Serial execution on a single thread, as supported by conventional processing techniques, may produce unacceptably long processing times for models that include two or more FCS's.

Exemplary Arrangement for Concurrent Processing

Figure 7:
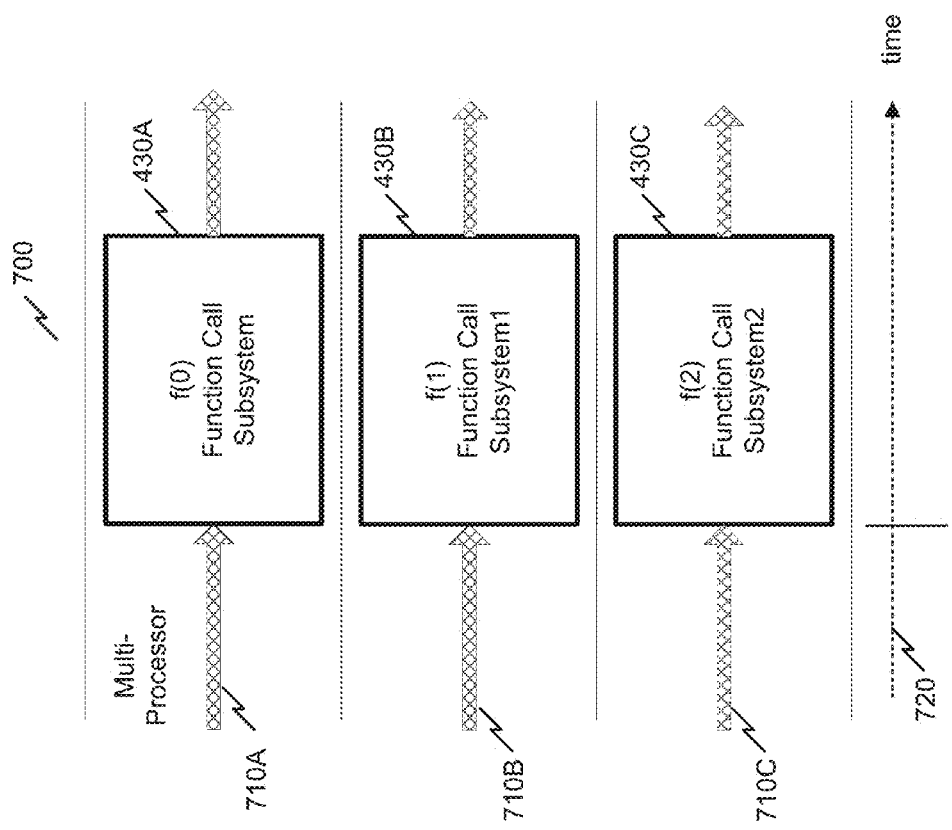
FIG. 7 illustrates an exemplary arrangement supporting concurrent (parallel) execution of function-call subsystems in accordance with an exemplary embodiment of the invention.

FIG. 7 illustrates an exemplary arrangement supporting concurrent (parallel) execution of FCS's in accordance with an exemplary embodiment of the invention. Arrangement 700 may include multi-processor threads 710A, B, and C and FCS's 430A, 430B, and 430C. Arrangement 700 may further include time axis 720 that can represent units of time that increase from left to right.

Referring to FIG. 7, thread 710A may be associated with a first piece of processing logic that can interpret and execute machine-readable instructions. Examples of processing logic can include but not limited to, a core on a processor, a processor in a group of processors, an FPGA, a GPU, a DSP, an ASIC, etc. Thread 710B may be associated with another core on the processor, as second processor in the group of processors, a second FPGA, GPU, DSP, ASIC, etc. And, thread 710C may be associated with still another piece of processing logic.

In FIG. 7, FCS 430A may execute on thread 710A, FCS 430B may execute on thread 710B, and FCS 430C may execute on thread 710C. In contrast to conventional single threaded implementations, the embodiment of FIG. 7 concurrently processes FCS's 430A, B, and C at the same time using threads 710A, B, and C, respectively. For example, all three FCS's begin executing at time $T_0$, with each FCS executing on a separate thread. FCS's 430A, B, and C may each produce a result at substantially the same time depending on the make up of the respective FCS's (e.g., number and/or type of components in a given FCS).

Embodiments employing the concurrent processing technique of FIG. 7 significantly shorten processing times for models that include multiple FCS's when the FCS's can be assigned to different threads.

Figure 8:
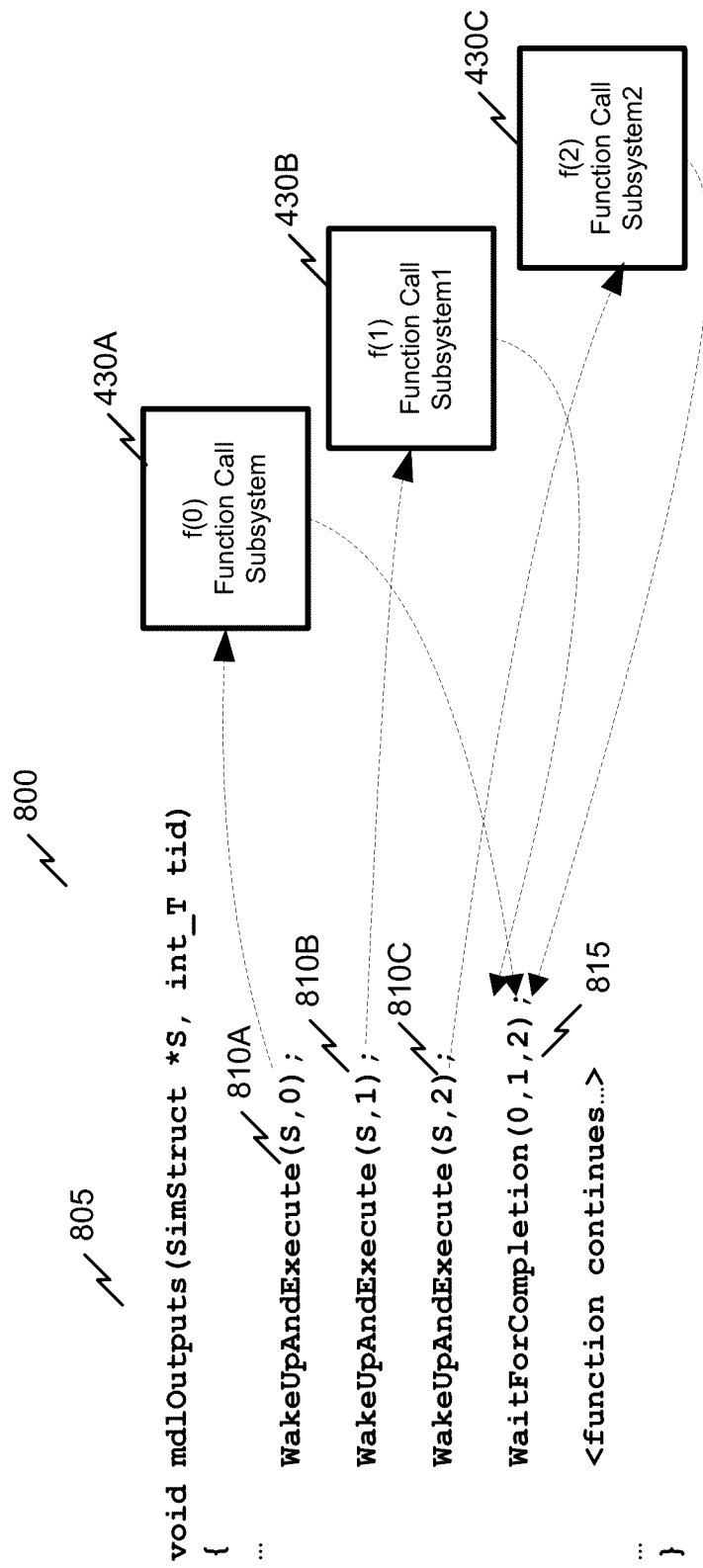
FIG. 8 illustrates an exemplary technique for supporting concurrent execution the function-call subsystems of FIG. 7.

FIG. 8 illustrates an exemplary technique for supporting concurrent execution of the FCS's of FIG. 7. Arrangement 800 can include program code 805 and FCS's 430A, B, and C. Code 805 may include a first call 810 that wakes up and executes FCS 430A. While FCS 430A is executing on a first thread, e.g., thread 710A, second call 810B may be encountered in code 805 and may wake up and execute FCS 430B. While FCS 430A and FCS 430B are executing, third call 810C may be encountered and may wake up and execute FCS 430C.

Arrangement 800 allows FCS 430A, B and C to execute concurrently. Code 805 may include command 815 that waits for FCS 430A, B, and C to finish executing before allowing other portions of code 805 to execute.

Exemplary embodiments may allow a user to take advantage of multi-threaded execution for allowing FCS's to concurrently execute in a model. In addition, embodiments may allow a user to concurrently execute FCS's using computer 130 without making significant modifications to an existing model. For example, in one embodiment, the user may replace a single block in a model to transform the model from single threaded execution to multi-threaded execution.

Exemplary Block for Concurrent Processing

Figure 9:
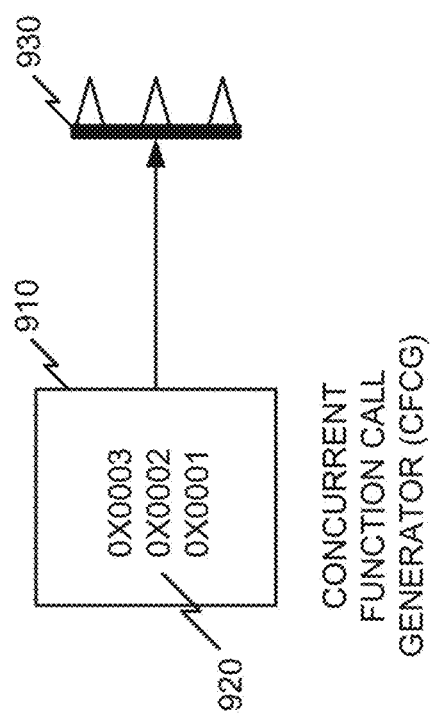
FIG. 9 illustrates an exemplary embodiment of a concurrent function-call generator block for use in concurrently executing a plurality of function-call subsystems in a graphical model.

FIG. 9 illustrates an exemplary embodiment of a concurrent function-call generator block for use in concurrently executing a plurality of FCS's in a graphical model. In an exemplary embodiment, a user can replace, for example, a conventional FCGB that supports single threaded execution with a concurrent function-call generator block (C-FCGB) that supports two or more concurrently operating threads.

Referring to FIG. 9, C-FCGB 910 may include a graphical representation displayable in a model, such as a block. Embodiments can include textual descriptions as to the type of block displayed in the model when desired. C-FCGB 910 may also include text, symbols, etc., for identifying processor affinities for use in performing concurrent processing of a model. For example, identifiers 920 may include bit masks that identify three pieces of processing logic, e.g., processors, for use in performing concurrent processing. The embodiment of FIG. 9 may further include demux 930 for receiving a signal from C-FCGB 910 and making the signal available to a determined one of FCS's in a model. Demux 930 may be a conventional demux that can be used with a conventional FCGB or with C-FCGB 910.

Exemplary Graphical User Interface

Figure 10A:
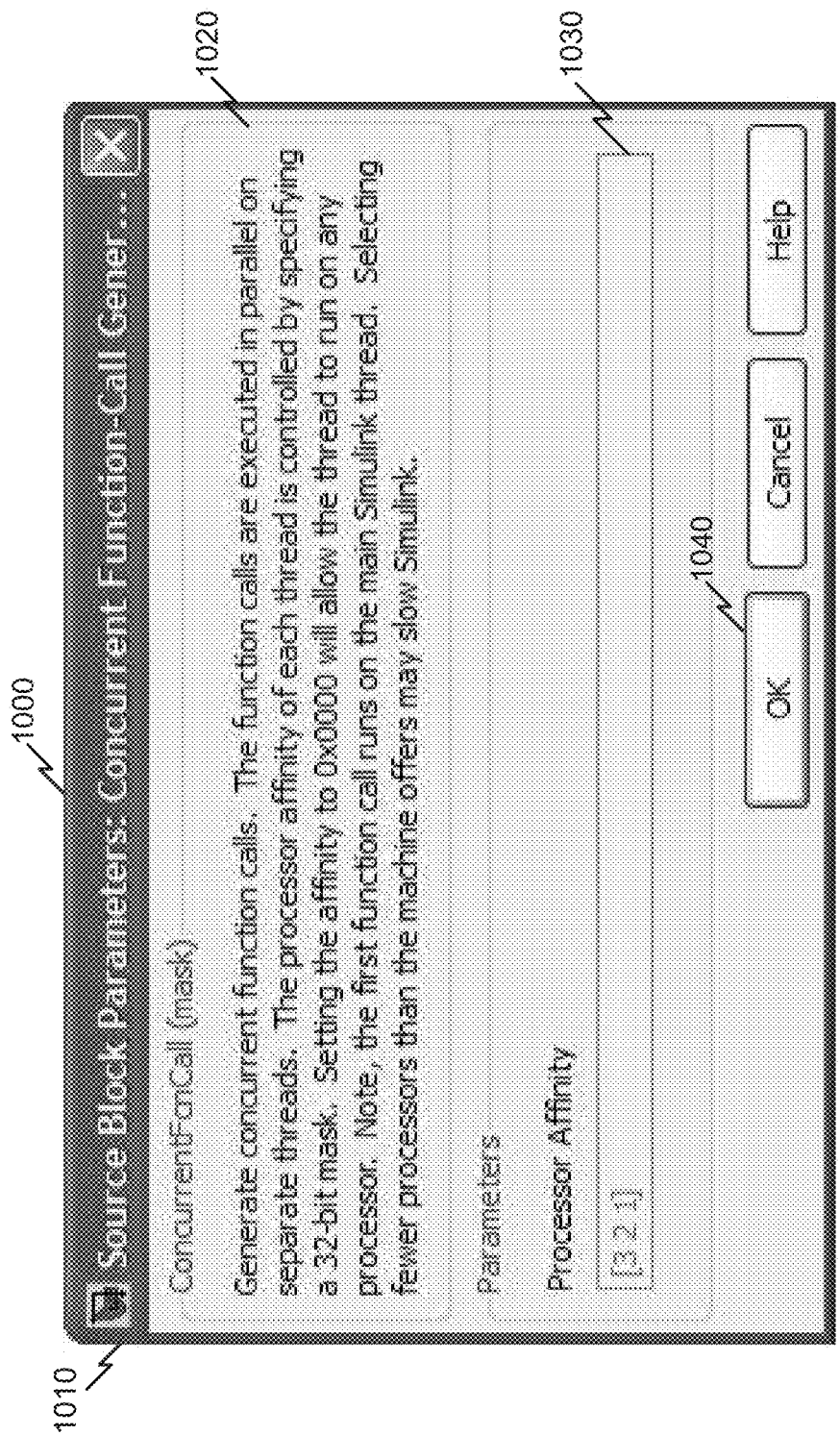
FIG. 10A illustrates an exemplary user interface for configuring a concurrent function-call generator blocks in accordance with an aspect of the invention.

FIG. 10A illustrates an exemplary user interface for configuring C-FCGB 910 in accordance with an aspect of the invention. FIG. 10A may include GUI 1000 for displaying information useful for configuring C-FCGB 910. GUI 1000 may include label 1010 for identifying the types of information input to GUI 1000 by a user. GUI 1000 may further include description 1020 that describes what information entered into GUI 1000 is used for, how the entered information is associated with types of processing logic, etc. GUI 1000 may further include parameter field 1030 for receiving parameters from a user. For example, a user may enter processor affinity information for C-FCGB 910 via parameter field 1030. In an embodiment, processor affinity information can include identifiers, such as textual (e.g., letters and/or numbers) and/or graphical identifiers that allow a user to associate processing logic with an FCS, a thread, etc. GUI 1000 may further include buttons 1040 for accepting user inputs, e.g., mouse clicks. Buttons 1040 can be used for accepting user inputs, canceling user inputs, accessing help menus, etc.

Figure 10B:
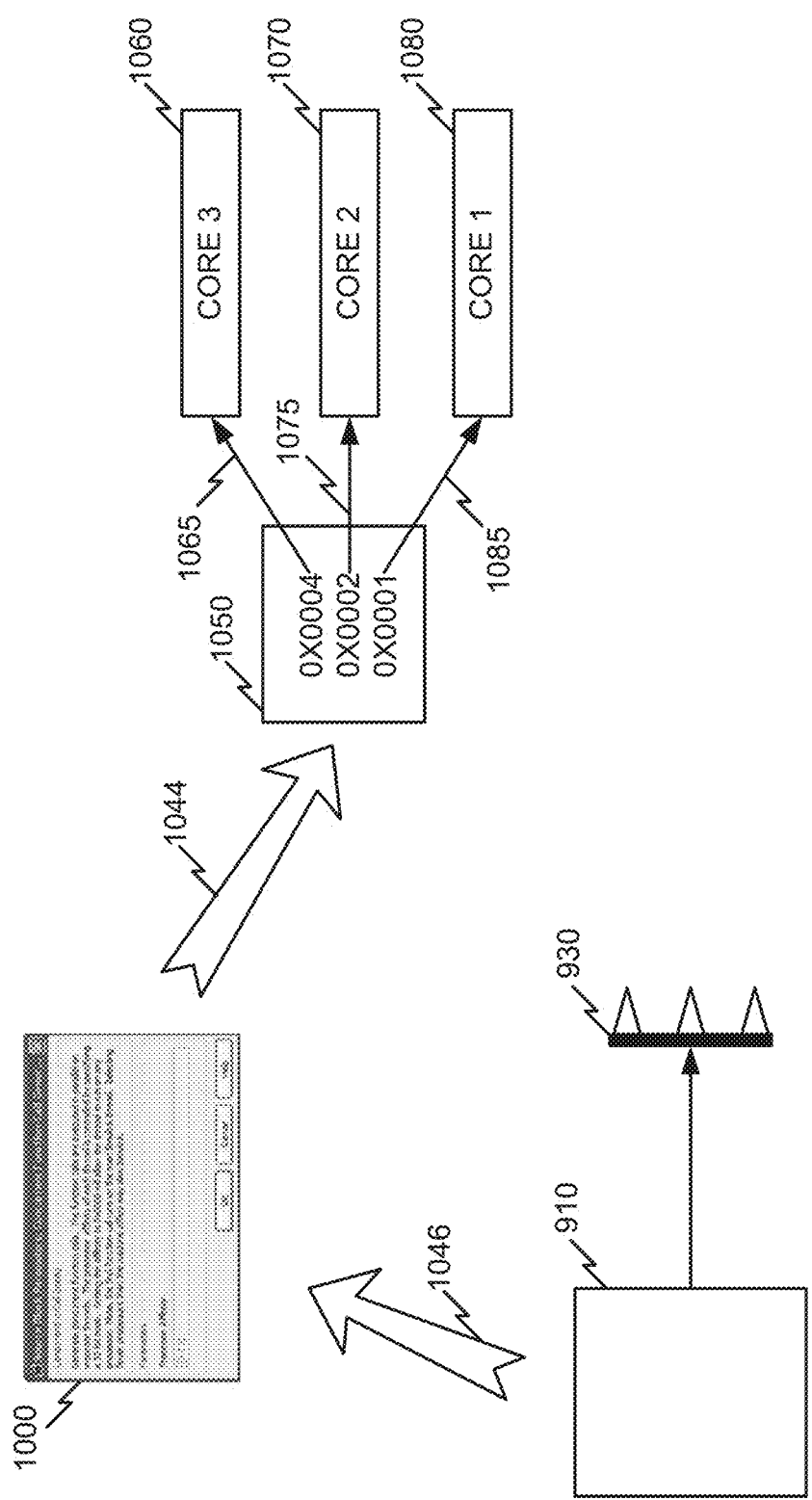
FIG. 10B illustrates an exemplary workflow for configuring an embodiment of the invention for concurrently processing a model that includes function-call subsystems.

FIG. 10B illustrates an exemplary workflow for configuring an embodiment of the invention for concurrently processing a model that includes FCS's. A user may interact with C-FCGB 910 using input device 120, such as a keyboard and/or mouse. For example, the user may double click over a graphical representation for C-FCGB 910 and may be presented with GUI 1000 (following workflow arrow 1046). GUI 100 may allow a user to configure a model for concurrently processing FCS's using a plurality of threads and/or processing devices. For example, the user may enter 3, 2 and 1 into GUI 1000 via parameter field 1030.

Information entered into parameter field 1030 may be stored in a data structure 1050 (following workflow arrow 1044). Information in data structure 1050 can be represented in a variety of formats that identify processing resources for performing concurrent processing of a model. For example, information in data structure 1050 can be stored as a bit mask, a universal resource locator (URL), an address, a name, etc. Referring to FIG. 10B, when bit masks are used to store information in data structure 1050, the stored information may indicate on which cores a thread is allowed to run. For example, 0x1 may indicate that a corresponding thread can run on a first core (e.g., core 1080 in FIG. 10B), bit mask 0x2 may indicate that a second thread can execute on a second core (e.g., core 1070 in FIG. 10B), and bit mask 0x3 may indicate that a third thread can execute on a third core (e.g., core 1060 in FIG. 10B). Threads in FIG. 10B may be associated with cores 1080 using link 1085, 1070 using link 1075, and with 1060 using link 1065.

Exemplary Model

Figure 11:
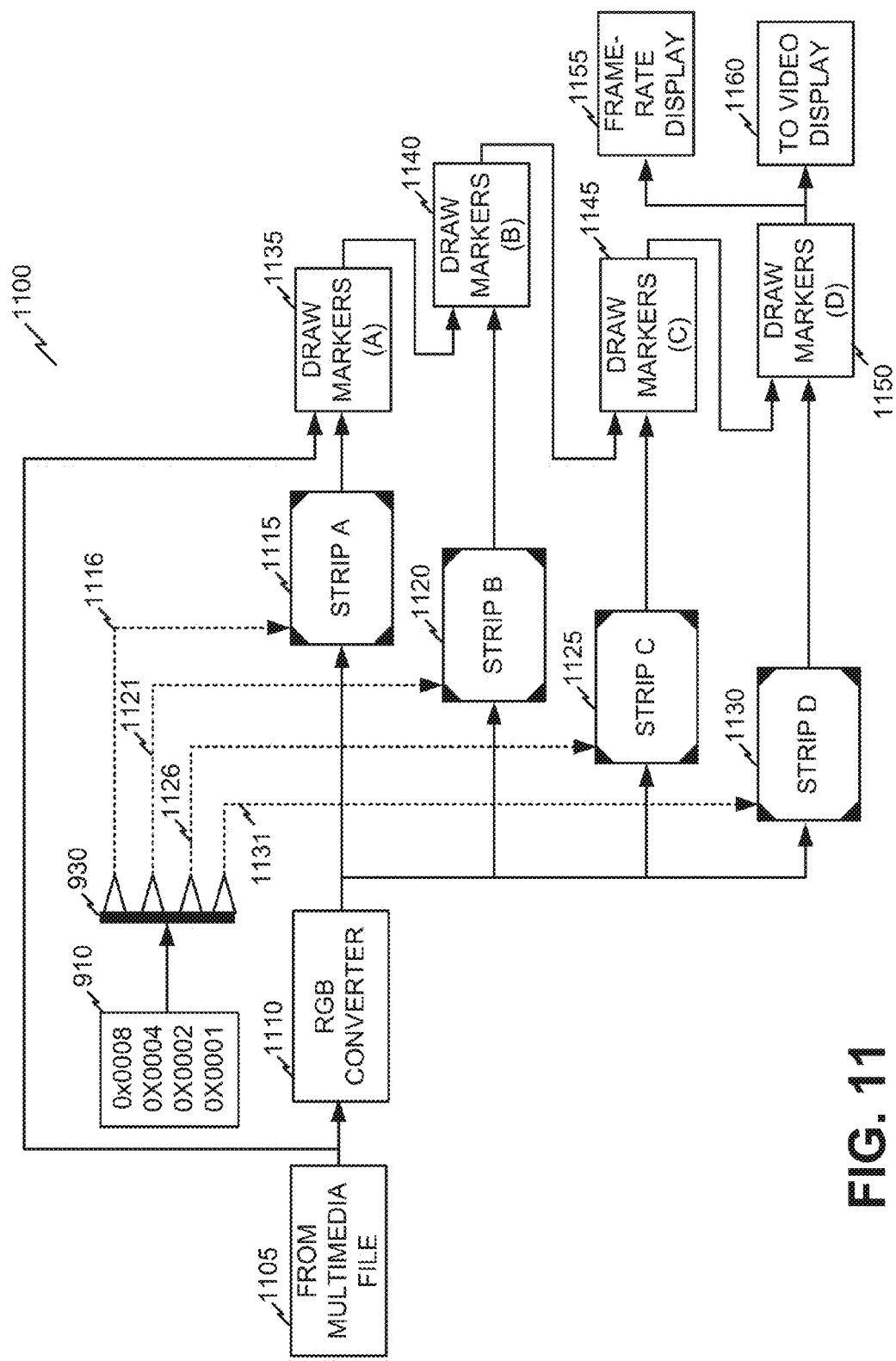
FIG. 11 illustrates an exemplary embodiment for concurrently processing image data.

FIG. 11 illustrates an exemplary embodiment for concurrently processing image data. Model 1100 may represent a system for processing image data using subsystems implemented as referenced models. A referenced model may be a model that is referenced by another model. For example block 1115 (strip A) may be a referenced model included in model 1100. Model 1100 may use the referenced model represented by block 1115 when model 1100 executes. In model 1100, referenced models 1115, 1120, 1125 and 1130 may not have data dependencies among the referenced models. For example, an image may include four strips of image data, where each strip can be processed independently using one of the referenced models.

A user of model 1100 may wish to use concurrent processing techniques to process image data passed through model 1100. The user may wish to use four cores to process data. Embodiments of the invention can make use of multiple cores on a single machine, such as computer 130, or cores that are distributed across multiple machines. The user may interact with GUI 1000 to configure C-FCGB 910 for concurrently using four cores. For example, the user may specify entries as displayed in FIG. 11 to indicate that one strip should be processed on each of the four cores. If desired, the user could further specify that a certain thread may run on core 1 and core 2, but not on core 3 if desired. Therefore, the embodiment of FIG. 11 is not limited to a particular way, or technique, for specifying processing logic on which to concurrently execute a plurality of threads associated with model 1100.

Model 1100 may receive image data from a multimedia file via block 1105. The received data may be provided to an RGB converter block 1110 to convert the received data into a format used by referenced models strip A 1115, strip B 1120, strip C 1125, and strip D 1130. When model 1100 is executed, C-FCGB 910 may send a signal to demux 930 that causes demux 930 to initiate strip A 1115 via signal 1116, strip B 1120 via signal 1121, strip C via signal 1126, strip D via signal 1131. C-FCGB 910 may further include mapping information that identifies particular processing logic on which each referenced model is to execute. For example, strip A 1115 may execute on a first core of a processor, strip B 1120 may execute on a second core of the processor, strip C 1125 may execute on a third core of the processor, and strip D 1130 may execute on a GPU residing on a computer hosting the processor.

When model 1100 executes, the referenced models may concurrently execute using the cores and GPU. Results of the respective referenced models may be further processed before a final result is displayed to a user. For example, marker drawing blocks 1135, 1140, 1145, and 1150 may be daisy chained together to process results from respective ones of the referenced models. An output of a final marker drawing block 1150 may be fed to a video display 1160 and to a frame rate display 1155.

Exemplary Processing

Figure 12:
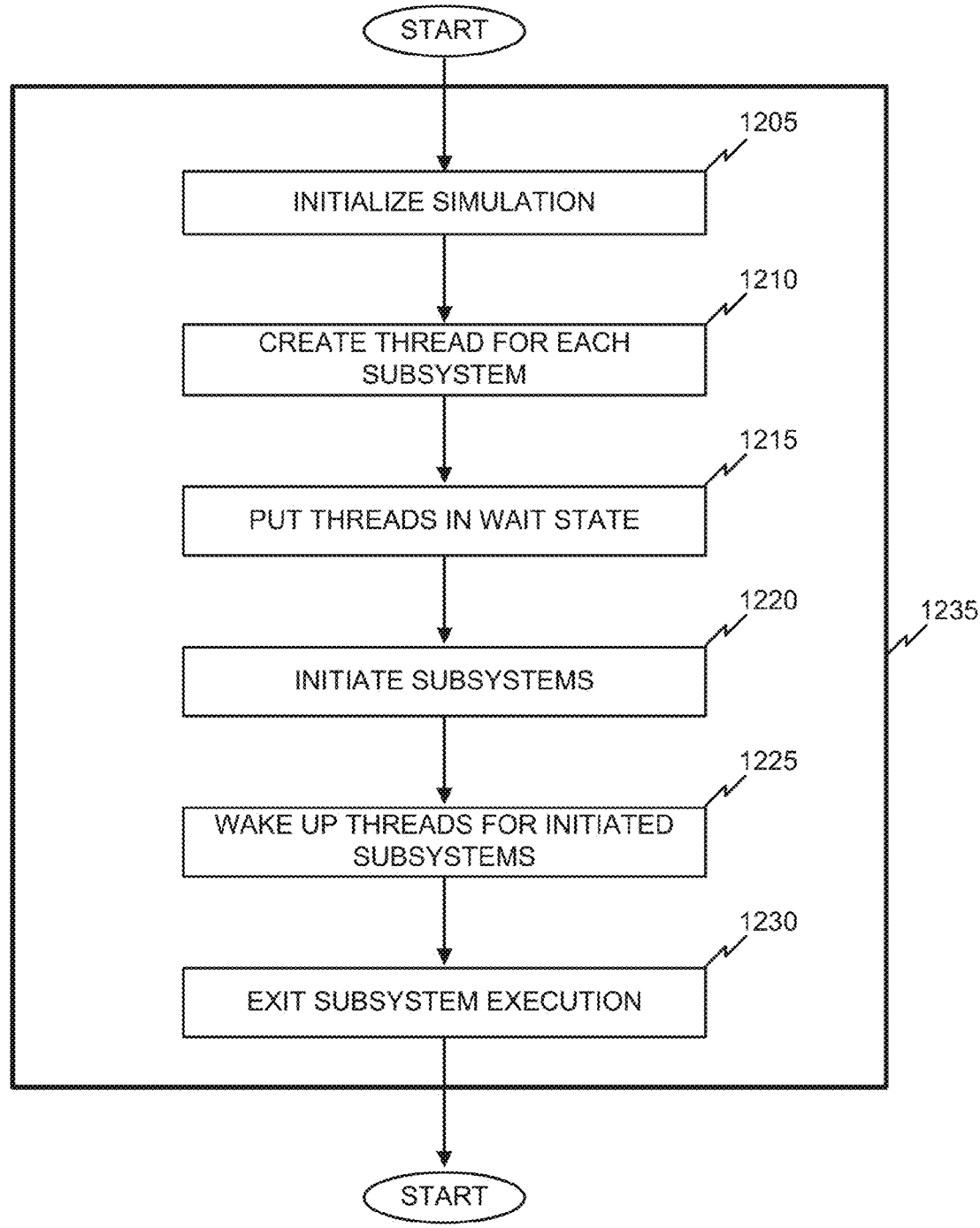
FIG. 12 illustrates an exemplary flowchart for performing processing consistent with an embodiment of the invention.

FIG. 12 illustrates an exemplary flowchart for performing processing consistent with an embodiment of the invention. A simulation may be initialized using computer 130. For example, model creator 210 may be used to create a graphical model that includes one or more subsystems that can be executed concurrently. The model may include C-FCGB 910 and demux 930 for providing signals that cause the subsystems to execute concurrently (act 1205). A user may initiate execution of the model and computer 130 may create a thread for each subsystem that will concurrently execute (act 1210).

Threads may be placed in wait states once they are created for the model (act 1215). A command may be initiated by C-FCGB 910 that causes subsystems in the model to begin executing concurrently (act 1220). Threads created for subsystems to be concurrently executed may be taken out of the wait state (act 1225). Subsystems in the model may concurrently execute using the available threads. When the subsystems have finished executing, subsystem execution may be exited (act 1230).

Figure 13:
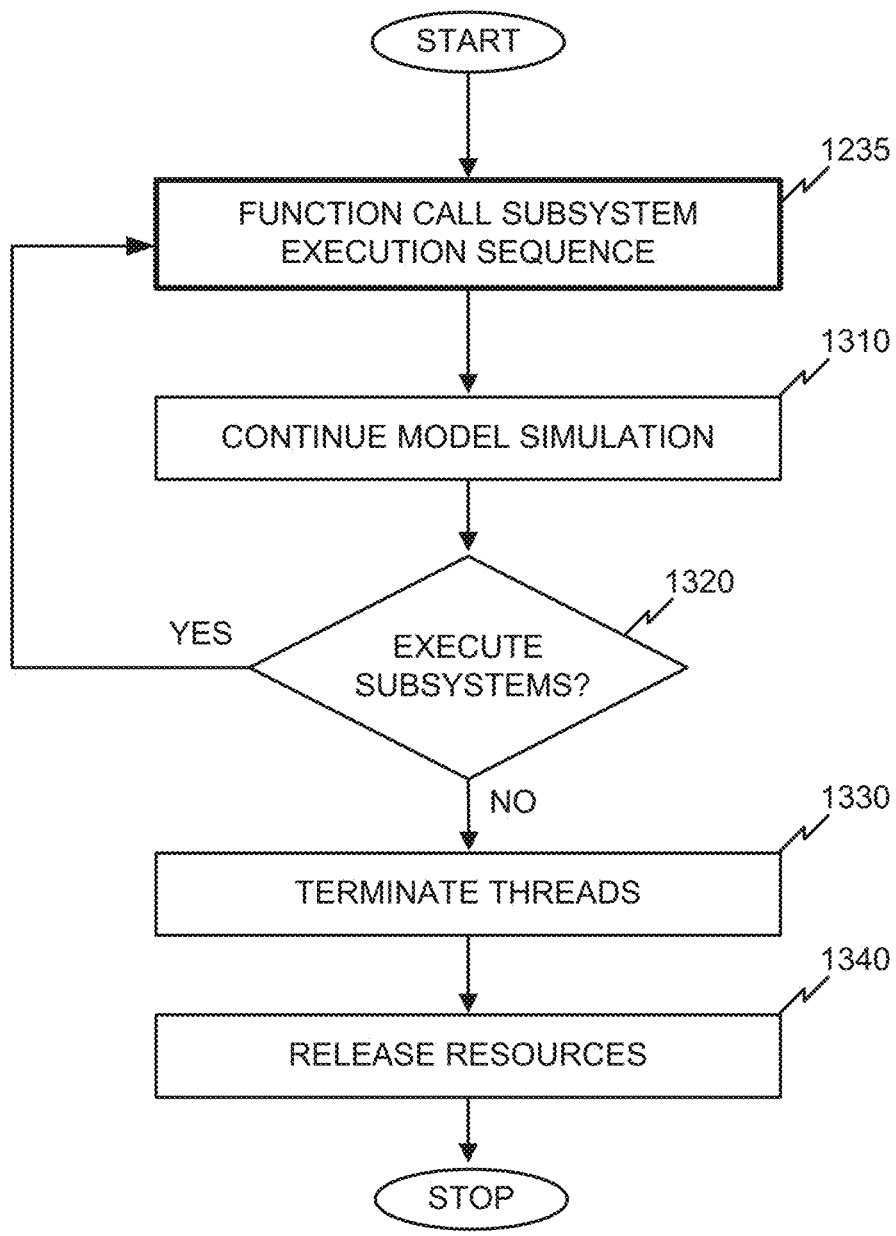
FIG. 13 illustrates exemplary processing for practicing an embodiment of the invention.

FIG. 13 illustrates exemplary processing for practicing an embodiment of the invention. The processing of FIG. 13 may leverage the processing of FIG. 12 when performing concurrent processing using subsystems in a graphical model. For example, when processing acts of FIG. 12 have finished (shown as act 1235 in FIG. 13), model simulation may continue using other blocks in the model (act 1310). During model execution, a determination may be made as to whether additional subsystems that were concurrently executed need to be executed again (act 1320). When the subsystems do not need to be executed again, threads created for the subsystems may be terminated (act 1330). Once the threads are terminated, resources associated with the threads, such as processing resources, memory resources, etc., may be released (act 1340).

In act 1320, when subsystems need to be executed, processing flow returns to act 1235, in which acts 1205-1230 may be executed as needed.

Exemplary Architecture

Figure 14:
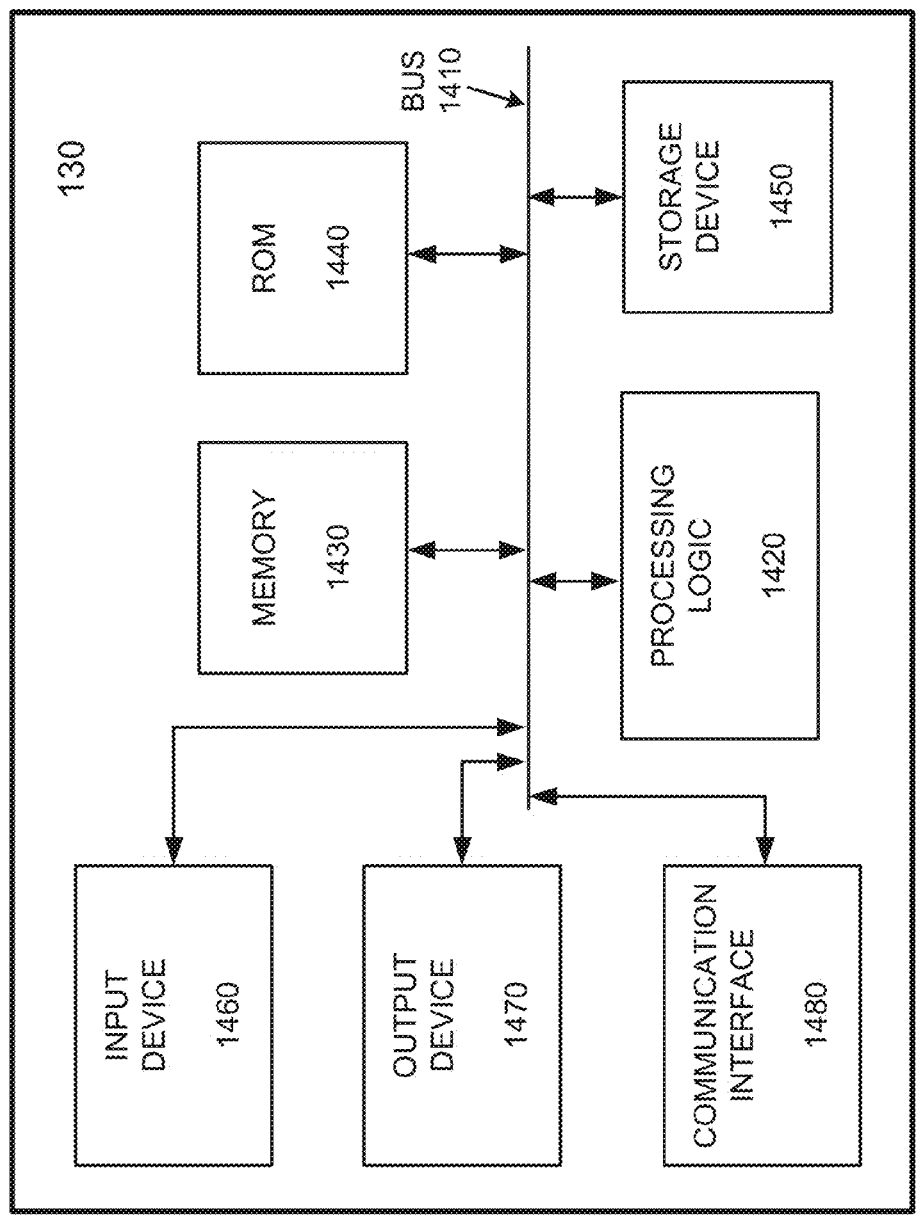
FIG. 14 illustrates an exemplary architecture for implementing the computer of FIG. 1.

FIG. 14 illustrates an exemplary computer architecture that can be used to implement computer 130 of FIG. 1. FIG. 14 is an exemplary diagram of an entity corresponding to computer 130. As illustrated, the entity may include a bus 1410, processing logic 1420, a main memory 1430, a read-only memory (ROM) 1440, a storage device 1450, an input device 1460, an output device 1470, and/or a communication interface 1480. Bus 1410 may include a path that permits communication among the components of the entity.

Processing logic 1420 may include a processor, microprocessor, or other types of processing logic (e.g., an FPGA), GPU, DSP, ASIC, etc.) that may interpret and execute instructions. For an implementation, processing logic 1420 may include a single core processor or a multi-core processor. In another implementation, processing logic 1420 may include a single processing device or a group of processing devices, such as a processing cluster or computing grid. In still another implementation, processing logic 1420 may include multiple processors that may be local or remote with respect each other, and may use one or more threads while processing.

Main memory 1430 may include a random access memory (RAM) or another type of dynamic storage device that may store information and instructions for execution by processing logic 1420. ROM 1440 may include a ROM device or another type of static storage device that may store static information and/or instructions for use by processing logic 1420. Storage device 1450 may include a magnetic, solid state and/or optical recording medium and its corresponding drive, or another type of static storage device that may store static information and/or instructions for use by processing logic 1420.

Input device 1460 may include logic that permits an operator to input information to the entity, such as a keyboard, a mouse, a pen, a touchpad, an accelerometer, a microphone, voice recognition, camera, neural interface, biometric mechanisms, etc. In an embodiment, input device 1460 may correspond to input device 120.

Output device 1470 may include a mechanism that outputs information to the operator, including a display, a printer, a speaker, a haptic interface, etc. In an embodiment, output device 1470 may correspond to display 110. Communication interface 1480 may include any transceiver-like logic that enables the entity to communicate with other devices and/or systems. For example, communication interface 1480 may include mechanisms for communicating with another device or system via a network.

The entity depicted in FIG. 14 may perform certain operations in response to processing logic 1420 executing software instructions stored in a tangible computer-readable storage medium, such as main memory 1430. A computer-readable storage medium may be defined as a physical or logical memory device. The software instructions may be read into main memory 1430 from another computer-readable storage medium, such as storage device 1450, or from another device via communication interface 1480. The software instructions contained in main memory 1430 may cause processing logic 1420 to perform techniques described herein when the software instructions are executed on processing logic. Alternatively, hardwired circuitry may be used in place of or in combination with software instructions to implement techniques described herein. Thus, implementations described herein are not limited to any specific combination of hardware circuitry and software.

Although FIG. 14 shows exemplary components of the entity, in other implementations, the entity may contain fewer, different, or additional components than depicted in FIG. 14. In still other implementations, one or more components of the entity may perform one or more tasks described as being performed by one or more other components of the entity.

Exemplary Distributed Embodiment

Distributed embodiments may perform processing using two or more processing resources. For example, embodiments can perform processing using two or more cores in a single processing device, distribute processing across multiple processing devices installed within a single enclosure, and/or distribute processing across multiple types of processing logic connected by a network.

Figure 15:
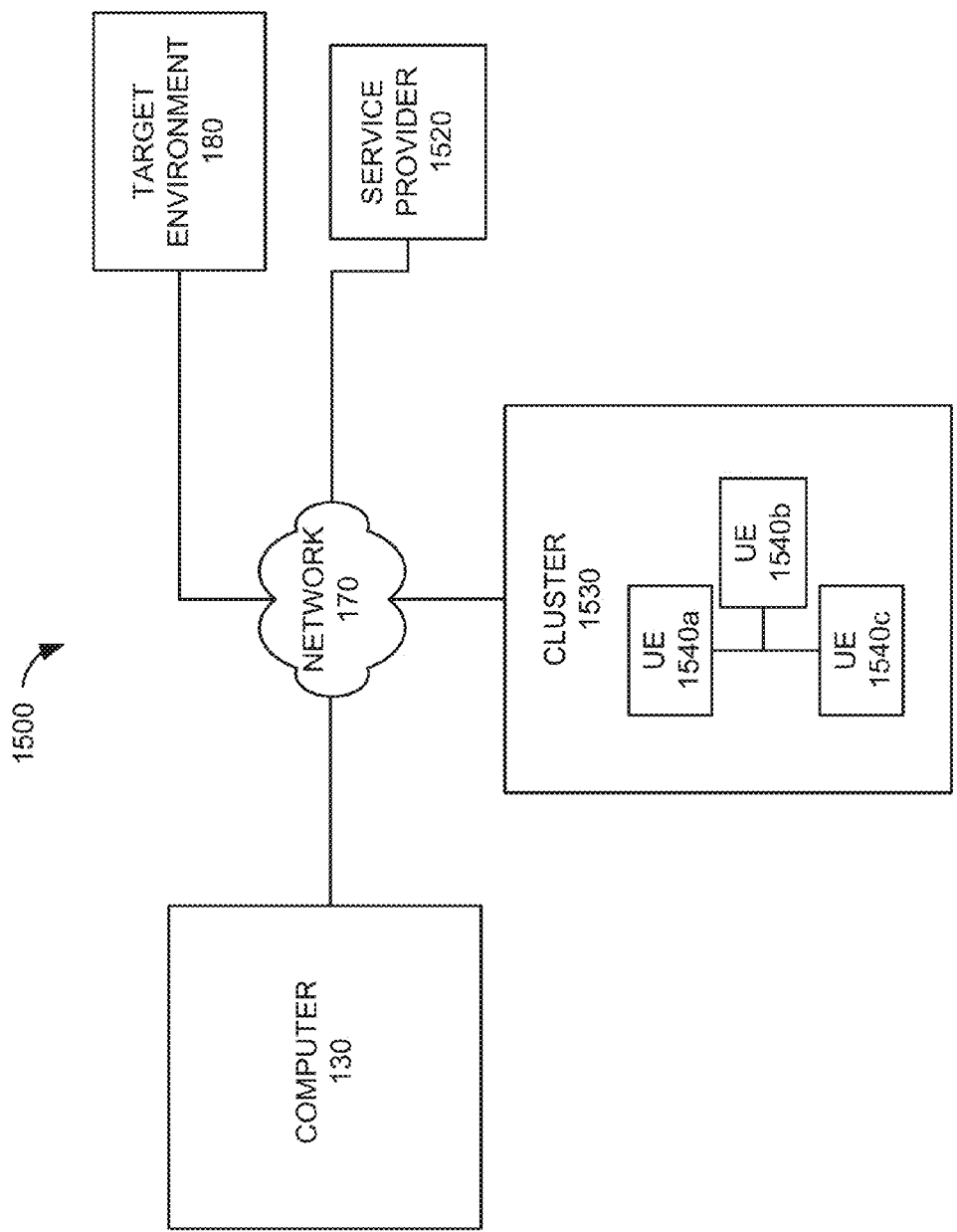
FIG. 15 illustrates an exemplary embodiment for implementing a distributed implementation of the invention.

FIG. 15 illustrates an exemplary system that can perform concurrent processing of graphical models using a plurality of threads. System 1500 may include computer 130, network 170, service provider 1520, and cluster 1530. The implementation of FIG. 15 is exemplary and other distributed implementations of the invention may include more devices and/or entities, fewer devices and/or entities, and/or devices/entities in configurations that differ from the exemplary configuration of FIG. 15.

Service provider 1520 may include a device that makes a service available to another device. For example, service provider 1520 may include an entity that provides one or more services to a destination using a server and/or other devices. Services may include instructions that are executed by a destination to perform an operation. Alternatively, a service may include instructions that are executed on behalf of a destination to perform an operation on the destination's behalf Assume, for sake of example, that a service provider operates a web server that provides one or more web-based services to a destination, such as computer 130. The web-based services may allow computer 130 to perform distributed simulations of electrical and/or mechanical systems using hardware that is operated by the service provider. For example, a user of computer 130 may be allowed to simulate models using two or more threads using the service provider's hardware. In an implementation, a customer (user) may receive services on a subscription basis. A subscription may include substantially any type of arrangement, such as monthly subscription, a per-use fee, a fee based on an amount of information exchanged between service provider 1520 and the customer, a fee based on a number of processor cycles used by the customer, a fee based on a number of processors used by the customer, etc.

Cluster 1530 may include a group of processing devices, such as units of execution 1540 that can be used to perform remote processing (e.g., distributed processing, parallel processing, etc.). Units of execution 1540 may include hardware and/or hardware/software based devices that perform processing operations on behalf of a requesting device, such as computer 130. In an embodiment, units of execution 1540 may each compute a partial result and the partial results can be combined into an overall result for a model.

Embodiments can perform activities described herein on graphical models executed in graphical modeling environments, such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from International Business Machines (IBM) Corporation; Ptolemy from the University of California at Berkeley; ASCET, CoWare, or aspects of a Unified Modeling Language (UML) or SysML environment. Graphical modeling environments can include block diagrams and/or other types of diagrams.

Embodiments may be implemented in a variety computing environments, such as environments that support statically or dynamically typed programming languages. For example, a dynamically typed language may be one used to express problems and/or solutions in mathematical notations familiar to those of skill in the relevant arts. For example, the dynamically typed language may use an array as a basic element, where the array may not require dimensioning. These arrays may be used to support array programming in that operations can apply to an entire set of values, such as values in an array. Array programming may allow array based operations to be treated as a high-level programming technique or model that lets a programmer think and operate on whole aggregations of data without having to resort to explicit loops of individual non-array, i.e., scalar operations. An exemplary embodiment that uses a dynamically typed language may be implemented in the Embedded MATLAB® programming language that can be used to create code for use in embedded applications.

CONCLUSION

Implementations may allow a user to transform a single threaded graphical model into a model supporting concurrent execution of subsystems using a plurality of threads.

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, while a series of acts has been described with regard to FIGS. 12 and 13, the order of the acts may be modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. For example, devices and/or entities may be added and/or removed from the implementations of FIG. 1, 2, 14, or 15 depending on specific deployments and/or applications. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

Headings and sub-headings used herein are to aid the reader by dividing the specification into subsections. These headings and sub-headings are not to be construed as limiting the scope of the invention or as defining the invention.

The scope of the invention is defined by the claims and their equivalents.

What is claimed is:

1. A method comprising:
    associating processing information with a block of a model,
        the block being connected to a first subsystem of the model and a second subsystem of the model,
        the associating the processing information being performed by a device, and
        the processing information including:
            first information that associates first processing logic with the first subsystem, and
            second information that associates second processing logic with the second subsystem,
                the second processing logic being different from the first processing logic;
    evaluating the model to determine whether a data dependency exists between the first subsystem and the second subsystem,
        the evaluating the model being performed by the device;
    providing a notification, indicating that the first subsystem cannot be concurrently processed with the second subsystem, when the data dependency exists between the first subsystem and the second subsystem,
        the providing the notification being performed by the device; and
    when the data dependency does not exist between the first subsystem and the second subsystem:
        causing, during an execution of the model, the first subsystem to be processed by the first processing logic concurrently with the second subsystem being processed by the second processing logic,
            a first thread being associated with the first subsystem based on an identifier associated with executing the first subsystem,
                the identifier being selected from a group that includes a bit mask, a uniform resource locator, an address, and a name, the first subsystem being processed by the first processing logic, via the first thread, based on the first processing logic and the first thread being associated with the first subsystem,
the causing the first subsystem to be processed by the first processing logic concurrently with the second subsystem being processed by the second processing logic being performed by the device.

2. The method of claim 1, where the associating the processing information with the block includes:
associating the processing information with the block based on the data dependency not existing between the first subsystem and the second subsystem.

3. One or more non-transitory computer-readable media storing instructions, the instructions comprising:
one or more instructions that, when executed by one or more processors, cause the one or more processors to:
receive, during an execution of a model, a signal for initiating an execution of a subsystem,
the subsystem including a group of functions for performing an operation associated with the execution of the model;
initiate, based on the signal, the execution of the subsystem;
determine whether a data dependency exists between a first group of functions included in the subsystem and a second group of functions included in another subsystem;
provide a notification, indicating that the first group of functions cannot be concurrently processed with the second group of functions, when the data dependency exists between the first group of functions and the second group of functions; and
when the data dependency does not exist between the first group of functions and the second group of functions:
execute, on first processing logic and via a first thread, the first group of functions to perform a first operation associated with the execution of the model,
the first processing logic and the first thread being associated with the first group of functions based on an identifier associated with executing the first group of functions,
the identifier being selected from a group that includes a bit mask, a uniform resource locator, an address, and a name,
the first group of functions being processed by the first processing logic, via the first thread, based on the first processing logic and the first thread being associated with the first group of functions;
execute, on second processing logic and via a second thread, the second group of functions to perform a second operation associated with the execution of the model,
the first group of functions executing on the first processing logic concurrently with the second group of functions executing on the second processing logic; and
generate, based on performing the first operation and the second operation, a result.

4. The one or more non-transitory computer-readable media of claim 3, where the instructions further comprise:
one or more instructions that, when executed by the one or more processors, cause the one or more processors to:
obtain another identifier associated with executing the first group of functions, and
execute the first group of functions on the first processing logic and via the first thread based on the other identifier.

5. A method comprising:
receiving, during an execution of a model, a signal for initiating an execution of a subsystem,
the subsystem including a group of functions for performing an operation associated with the execution of the model, and
the receiving the signal being performed by a device;
initiating, based on the signal, the execution of the subsystem,
the initiating the execution being performed by the device;
determining whether a data dependency exists between a first group of functions included in the subsystem and a second group of functions included in another subsystem,
the determining whether the data dependency exists being performed by the device;
providing a notification, indicating that the first group of functions cannot be concurrently processed with the second group of functions, when the data dependency exists between the first group of functions and the second group of functions,
the providing the notification being performed by the device; and
when the data dependency does not exist between the first group of functions and the second group of functions:
executing, on first processing logic and via a first thread, the first group of functions to perform a first operation associated with the execution of the model,
the first processing logic and the first thread being associated with the first group of functions based on an identifier associated with the first group of functions,
the identifier being selected from a group that includes a bit mask,
a uniform resource locator, an address, and a name,
the first group of functions being processed by the first processing logic, via the first thread, based on the first processing logic and the first thread being associated with the first group of functions,
the executing the first group of functions being performed by the device;
executing, on second processing logic and via a second thread, the second group of functions to perform a second operation associated with the execution of the model,
the first group of functions executing on the first processing logic concurrently with the second group of functions executing on the second processing logic, and
the executing the second group of functions being performed by the device; and
generating, based on performing the first operation and the second operation, a result,
the generating the result being performed by the device.

6. The method of claim 5, further comprising:
obtaining another identifier associated with executing the second group of functions,
the other identifier being selected from a group that includes another bit mask, another uniform resource locator, another address, and another name, associating the second processing logic and the second thread with the second group of functions based on the other identifier, and executing the second group of functions on the second processing logic via the second thread based on the second processing logic and the second thread being associated with the second group of functions.

7. One or more non-transitory computer-readable media storing instructions, the instructions comprising:
one or more instructions that, when executed by one or more processors, cause the one or more processors to:
receive program code generated based on a model that includes a concurrent function call generator block,
the concurrent function call generator block configured to cause, during an execution of the model, a first subsystem to be processed on first processing logic concurrently with a second subsystem being processed on second processing logic,
the second processing logic being different from the first processing logic;
determine whether a data dependency exists between the first subsystem and the second sub system;
provide a notification, indicating that the first subsystem cannot be concurrently processed with the second subsystem, when the data dependency exists between the first subsystem and the second subsystem; and
when the data dependency does not exist between the first subsystem and the second subsystem:
execute the program code to execute the model,
executing the program code causing the concurrent function call generator block to cause the first subsystem to be processed on the first processing logic concurrently with the second subsystem being processed on the second processing logic,
the first processing logic and a first thread being associated with the first subsystem based on an identifier associated with executing the first subsystem,
the identifier being selected from a group that includes a bit mask, a uniform resource locator, an address, and a name,
the first subsystem being processed by the first processing logic, via the first thread, based on the first processing logic and the first thread being associated with the first subsystem.

8. The one or more non-transitory computer-readable media of claim 7, where the instructions further comprise:
one or more instructions that, when executed by the one or more processors, cause the one or more processors to:
execute a first portion of the program code,
initiate, based on executing the first portion of the program code, the first subsystem being processed on the first processing logic concurrently with the second subsystem being processed on the second processing logic,
receive a first result associated with the processing of the first subsystem and a second result associated with the processing of the second subsystem, and
execute a second portion of the program code based on the first result and the second result.

9. A method comprising:
receiving program code generated based on a model that includes a concurrent function call generator block,
the receiving the program code being performed by a device, and
the concurrent function call generator block being configured to cause, during an execution of the model, a first subsystem to be processed on first processing logic concurrently with a second subsystem being processed on second processing logic,
the second processing logic being different from the first processing logic;
determining whether a data dependency exists between the first subsystem and the second subsystem,
the determining whether the dependency exists being performed by the device;
providing a notification, indicating that the first subsystem cannot be concurrently processed with the second subsystem, when the data dependency exists between the first subsystem and the second subsystem,
the providing the notification being performed by the device; and
when the data dependency does not exist between the first subsystem and the second subsystem:
executing the program code to execute the model,
the executing the program code causing the concurrent function call generator block to cause the first subsystem to be processed on the first processing logic concurrently with the second subsystem being processed on the second processing logic,
the first processing logic and a first thread being associated with the first subsystem based on an identifier associated with executing the first subsystem,
the identifier being selected from a group that includes a bit mask, a uniform resource locator, an address, and a name,
the first subsystem being processed by the first processing logic, via the first thread, based on the first processing logic and the first thread being associated with the first subsystem, and
the executing the program code being performed by the device.

10. The method of claim 9, further comprising:
executing a first portion of the program code,
initiating, after executing the first portion of the program code, the first subsystem being processed on first processing logic concurrently with the second subsystem being processed on the second processing logic,
receiving, prior to executing a second portion of the program code, a first result associated with the processing of the first subsystem and with the processing of the second subsystem, and
executing a second portion of the program code based on the first result to determine a final result.

11. One or more non-transitory computer-readable media storing instructions, the instructions comprising:
one or more instructions that, when executed by one or more processors, cause the one or more processors to:
obtain program code for executing a model that includes a plurality of subsystems;
initiate an execution of the model based on the program code;
execute, based on initiating the execution of the model, a first portion of the model;
determine whether data dependencies exist between the plurality of subsystems;

provide a notification, indicating that the plurality of subsystems cannot be concurrently processed, when the data dependencies exist between the plurality of subsystems; and when no data dependencies exist between the plurality of subsystems:

initiate, based on executing the first portion of the model and based on no data dependencies existing between the plurality of subsystems, a concurrent execution of the plurality of subsystems associated with the model, first processing logic and a first thread being associated with one of the plurality of subsystems based on an identifier, the identifier being selected from a group that includes a bit mask, a uniform resource locator, an address, and a name, the one of the plurality of subsystems being processed by the first processing logic, via the first thread, based on the first processing logic and the first thread being associated with the one of the plurality of subsystems;

receive, based on initiating the concurrent execution of the plurality of subsystems, a result associated with each subsystem, of the plurality of subsystems; and execute, based on receiving the result associated with each subsystem, a second portion of the model.

12. The one or more non-transitory computer-readable media of claim 11, further comprising:

one or more instructions that, when executed by the one or more processors, cause the one or more processors to:

execute each of the plurality of subsystems via corresponding processing logic.

13. A method comprising:

obtaining program code for executing a model that includes a plurality of subsystems, the obtaining the program code being performed by a device;

initiating an execution of the model based on the program code, the initiating the execution of the model being performed by the device;

executing, based on initiating the execution of the model, a first portion of the model, the executing the first portion of the model being performed by the device;

determining whether data dependencies exist between the plurality of subsystems, the determining whether data dependencies exists being performed by the device;

providing a notification, indicating that the plurality of subsystems cannot be concurrently processed, when the data dependencies exist between the plurality of subsystems, the providing the notification being performed by the device; and when no data dependencies exist between the plurality of subsystems:

initiating, based on executing the first portion of the model and based on no data dependencies existing between the plurality of subsystems, a concurrent execution of the plurality of subsystems associated with the model, first processing logic and a first thread being associated with one of the plurality of subsystems based on an identifier, the identifier being selected from a group that includes a bit mask, a uniform resource locator, an address, and a name, the one of the plurality of subsystems being processed by the first processing logic, via the first thread, based on the first processing logic and the first thread being associated with the one of the plurality of subsystems, the initiating the concurrent execution of the plurality of subsystems being performed by the device;

receiving, based on initiating the concurrent execution of the plurality of subsystems, a result associated with each subsystem, of the plurality of subsystems, the receiving the result associated with each subsystem being performed by the device; and executing, based on receiving the result associated with each subsystem, a second portion of the model, the executing the second portion of the model being performed by the device.

14. The method of claim 13, further comprising:

executing each of the plurality of subsystems via corresponding processing logic.

15. One or more non-transitory computer-readable media storing instructions, the instructions comprising:

one or more instructions that, when executed by one or more processors, cause the one or more processors to:

connect a block of a model to a first subsystem of the model and to a second subsystem of the model;

determine whether a data dependency exists between the first subsystem and the second subsystem;

provide a notification, indicating that the first subsystem cannot be concurrently processed with the second subsystem, when the data dependency exists between the first subsystem and the second subsystem; and selectively cause, during an execution of the model and based on whether the data dependency exists between the first subsystem and the second subsystem, one of:

a concurrent execution of the first subsystem and the second subsystem, or a serial execution of the first subsystem and the second subsystem, the concurrent execution being caused when the data dependency does not exist between the first subsystem and the second subsystem, and the serial execution being caused when the data dependency does exist between the first subsystem and the second subsystem, first processing logic and a first thread being associated with the first subsystem based on an identifier associated with executing the first subsystem, the identifier being selected from a group that includes a bit mask, a uniform resource locator, an address, and a name, the first subsystem being processed by the first processing logic, via the first thread, based on the first processing logic and the first thread being associated with the first subsystem.

16. The one or more non-transitory computer-readable media of claim 15, where the block is connected to the first subsystem and the second subsystem via a demultiplexer associated with the block.

17. A method comprising:
connecting a block of a model to a first subsystem of the model and to a second subsystem of the model,
the connecting the block being performed by a device;
determining whether a data dependency exists between the first subsystem and the second subsystem,
the determining whether the data dependency exists being performed by the device;
providing a notification, indicating that the first subsystem cannot be concurrently processed with the second subsystem, when the data dependency exists between the first subsystem and the second subsystem,
the providing the notification being performed by the device; and
selectively causing, during an execution of the model and based on whether the data dependency exists between the first subsystem and the second subsystem, one of:
a concurrent execution of the first subsystem and the second subsystem, or
a serial execution of the first subsystem and the second subsystem,
the concurrent execution being caused when the data dependency does not exist between the first subsystem and the second subsystem, and
the serial execution being caused when the data dependency does exist between the first subsystem and the second subsystem,
first processing logic and a first thread being associated with the first subsystem based on an identifier associated with executing the first subsystem,
the identifier being selected from a group that includes a bit mask, a uniform resource locator, an address, and a name,
the first subsystem being processed by the first processing logic, via the first thread, based on the first processing logic and the first thread being associated with the first subsystem,
the selectively causing the one of the concurrent execution or the serial execution being performed by the device.

18. The method of claim 17, where the block is connected to the first subsystem and the second subsystem via a demultiplexer associated with the block.

19. One or more non-transitory computer-readable media storing instructions, the instructions comprising:
one or more instructions that, when executed by one or more processors, cause the one or more processors to:
associate processing information with a block of a model,
the block being connected to a first subsystem of the model and a second subsystem of the model,
the processing information including:
first information that associates first processing logic with the first subsystem, and
second information that associates second processing logic with the second subsystem,
the second processing logic being different from the first processing logic;
evaluate the model to determine whether a data dependency exists between the first subsystem and the second subsystem; and
provide an indication, indicating that the first subsystem cannot be concurrently processed with the second subsystem, when the data dependency exists between the first subsystem and the second subsystem; or
when the data dependency does not exist between the first subsystem and the second subsystem:
cause, during an execution of the model, the first subsystem to be processed by the first processing logic concurrently with the second subsystem being processed by the second processing logic,
a first thread being associated with the first subsystem based on an identifier associated with executing the first subsystem,
the identifier being selected from a group that includes a bit mask, a uniform resource locator, an address, and a name,
the first subsystem being processed by the first processing logic, via the first thread, based on the first processing logic and the first thread being associated with the first subsystem.

20. The one or more non-transitory computer-readable media of claim 19, where the one or more instructions to associate the processing information with the block include:
one or more instructions that, when executed by the one or more processors, cause the one or more processors to associate the processing information with the block based on the data dependency not existing between the first subsystem and the second subsystem.

21. The one or more non-transitory computer-readable media of claim 19, where the instructions further comprise:
one or more instructions that, when executed by the one or more processors, cause the one or more processors to:
generate code for the model,
the code being configured for execution in a target environment, and
execute the code in the target environment.

* * * * *